United States Patent
Yoneda et al.

(10) Patent No.: US 9,923,134 B2
(45) Date of Patent: Mar. 20, 2018

(54) METHOD OF MANUFACTURING LIGHT EMITTING DEVICE WITH EXPOSED WIRE END PORTIONS

(71) Applicant: Nichia Corporation, Anan-shi, Tokushima (JP)

(72) Inventors: Akinori Yoneda, Anan (JP); Yoshiyuki Aihara, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/169,066

(22) Filed: May 31, 2016

(65) Prior Publication Data
US 2016/0276562 A1   Sep. 22, 2016

Related U.S. Application Data

(63) Continuation of application No. 14/581,639, filed on Dec. 23, 2014, now Pat. No. 9,379,287.

(30) Foreign Application Priority Data

Dec. 25, 2013   (JP) .................................. 2013-266464
Dec. 22, 2014   (JP) .................................. 2014-259029

(51) Int. Cl.
*H01L 33/00*     (2010.01)
*H01L 33/62*     (2010.01)
(Continued)

(52) U.S. Cl.
CPC .......... *H01L 33/62* (2013.01); *H01L 33/0095* (2013.01); *H01L 33/38* (2013.01);
(Continued)

(58) Field of Classification Search
CPC .............................. H01L 33/60; H01L 33/20
(Continued)

(56) References Cited

U.S. PATENT DOCUMENTS

2005/0156189 A1*   7/2005   Deguchi ................. H01L 33/38
                                                              257/103
2006/0261364 A1*  11/2006   Suehiro ................... H01L 33/56
                                                              257/100
(Continued)

FOREIGN PATENT DOCUMENTS

JP   H05-299530 A   11/1993
JP   2003-282957 A  10/2003
(Continued)

OTHER PUBLICATIONS

Extended European Search Report dated May 22, 2015 issued in Application No. 14199926.8.
(Continued)

*Primary Examiner* — Jami M Valentine
(74) *Attorney, Agent, or Firm* — Foley & Lardner LLP

(57) ABSTRACT

A light emitting device is constituted with a semiconductor light emitting element on which a support member is disposed on one surface provided with a p-side electrode and an n-side electrode and a fluorescent material layer is disposed on the other surface which is an opposite side of the one surface. The support member includes a resin layer, an electrode for p-side external connection and an electrode for n-side external connection disposed exposed at a surface opposite side of a surface where the resin layer is in touch with a light emitting element, and internal wirings disposed in the resin layer and electrically connecting between a p-side electrode and the electrode for p-side external connection respectively. The internal wirings include a metal wire and a metal plated layer, and a metal wire and a metal plated layer respectively connected in series.

23 Claims, 20 Drawing Sheets

(51) Int. Cl.
  *H01L 33/38* (2010.01)
  *H01L 33/50* (2010.01)
  *H01L 33/54* (2010.01)
  *H01L 33/48* (2010.01)
  *H01L 33/52* (2010.01)

(52) U.S. Cl.
  CPC .......... *H01L 33/486* (2013.01); *H01L 33/507* (2013.01); *H01L 33/54* (2013.01); *H01L 33/52* (2013.01); *H01L 2224/4813* (2013.01); *H01L 2933/005* (2013.01); *H01L 2933/0033* (2013.01); *H01L 2933/0041* (2013.01); *H01L 2933/0066* (2013.01)

(58) Field of Classification Search
  USPC ........................................ 257/98; 438/22, 29
  See application file for complete search history.

(56) References Cited

U.S. PATENT DOCUMENTS

| | | | | |
|---|---|---|---|---|
| 2007/0228391 A1* | 10/2007 | Minami | .................. | H01L 33/62 257/79 |
| 2010/0148198 A1 | 6/2010 | Sugizaki et al. | | |
| 2011/0027921 A1 | 2/2011 | Hamasaki et al. | | |
| 2013/0005210 A1* | 1/2013 | Takeda | .................. | H01L 24/97 445/23 |
| 2013/0037748 A1* | 2/2013 | Kato | .................. | C09K 11/7721 252/301.36 |
| 2013/0313589 A1 | 11/2013 | Tomizawa et al. | | |
| 2013/0334685 A1* | 12/2013 | Kim | .................... | H01L 23/5389 257/738 |
| 2014/0001502 A1 | 1/2014 | Akimoto et al. | | |
| 2014/0175471 A1 | 6/2014 | Akimoto et al. | | |
| 2015/0207042 A1* | 7/2015 | Yoneda | .................. | H01L 33/38 257/98 |

FOREIGN PATENT DOCUMENTS

| | | |
|---|---|---|
| JP | 2008-251794 A | 10/2008 |
| JP | 2010-141176 A | 6/2010 |
| JP | 2011-258676 A | 12/2011 |
| JP | 2014-003283 A | 1/2014 |
| JP | 2014-011275 A | 1/2014 |
| WO | WO-2009/009436 A2 | 1/2009 |
| WO | WO-2013/021519 A1 | 2/2013 |

OTHER PUBLICATIONS

Non-Final Office Action for U.S. Appl. No. 14/581,639 dated Oct. 26, 2015.

Notice of Allowance for U.S. Appl. No. 14/581,639 dated Mar. 1, 2016.

* cited by examiner

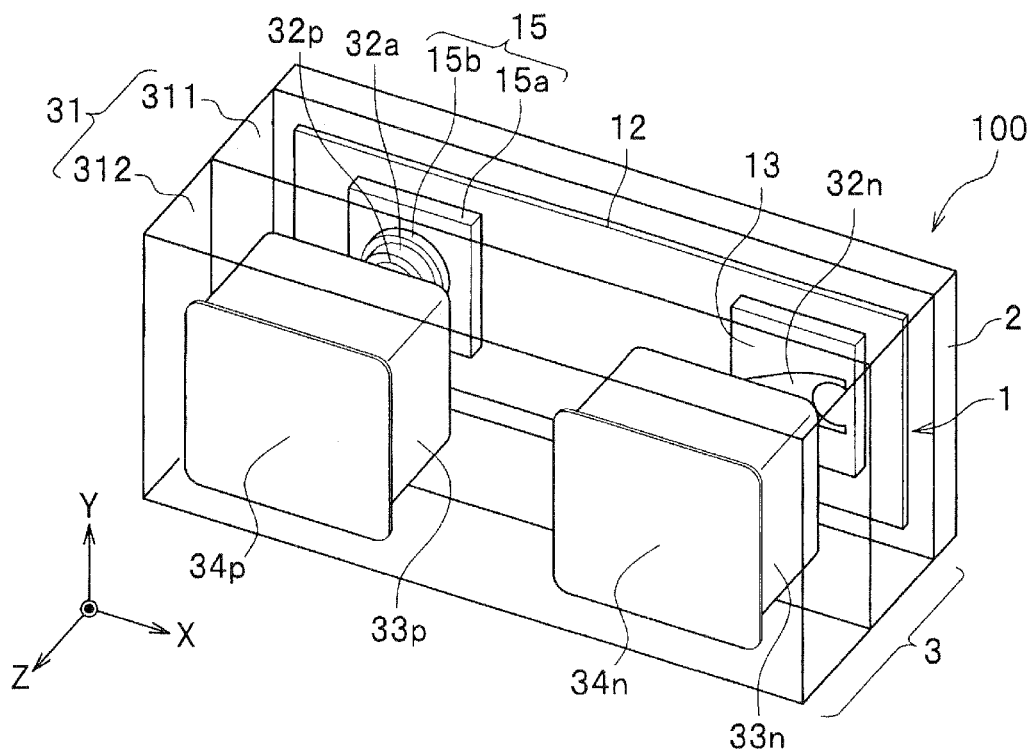
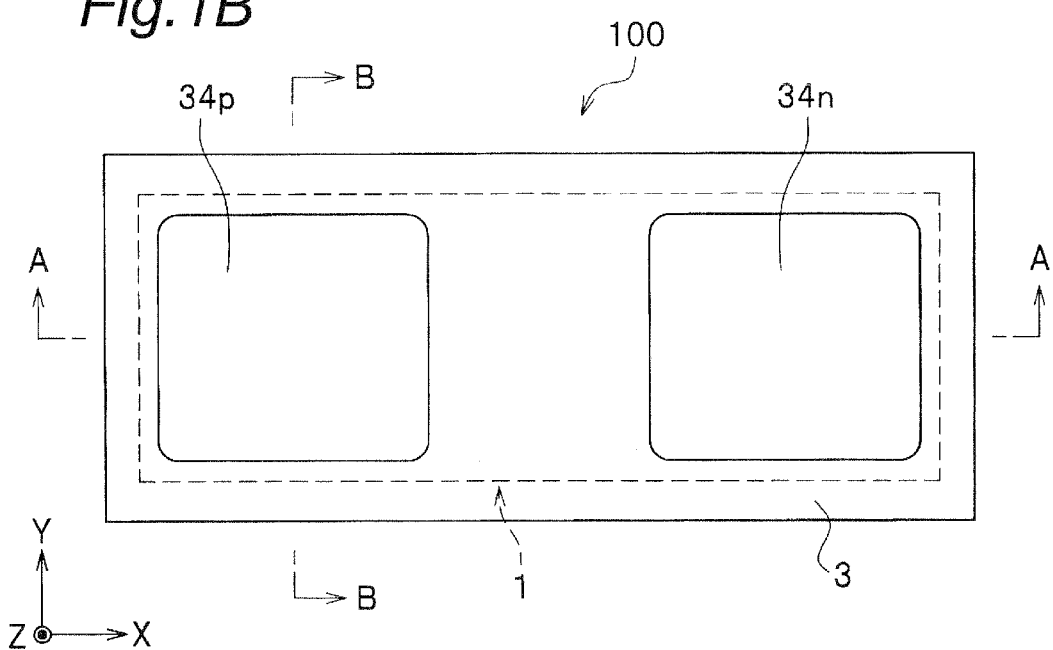

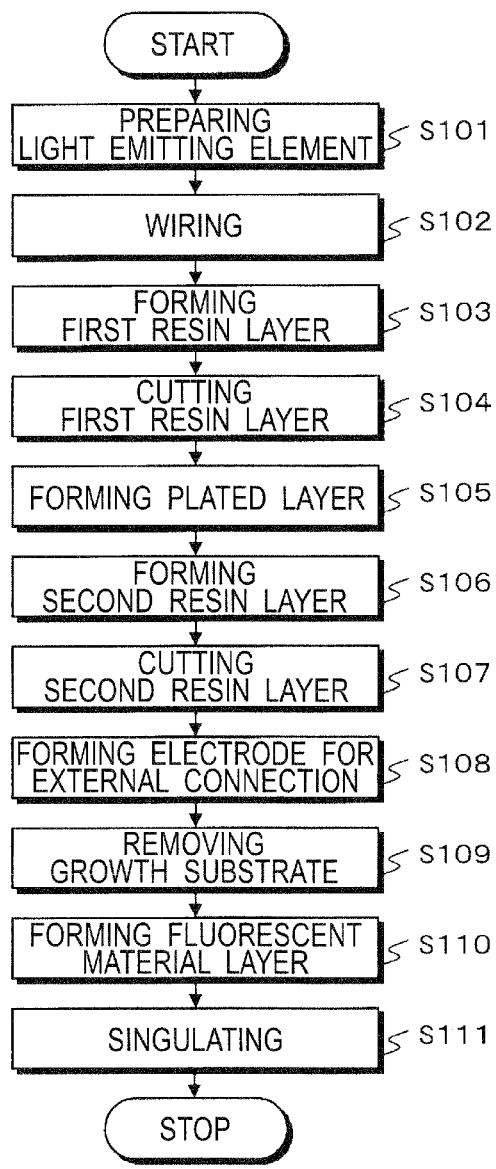

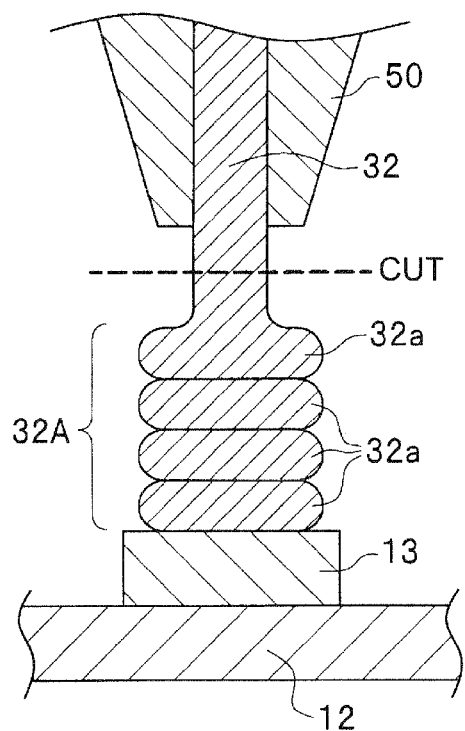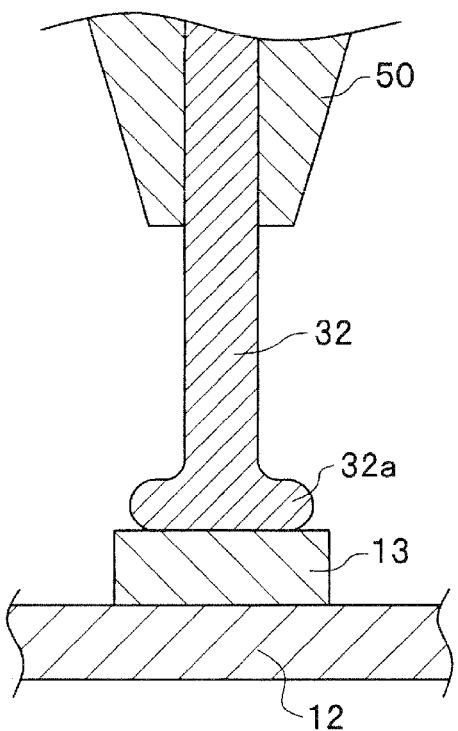

METHOD OF MANUFACTURING LIGHT EMITTING DEVICE WITH EXPOSED WIRE END PORTIONS

CROSS-REFERENCE TO RELATED APPLICATIONS

The present application is a continuation of U.S. patent application Ser. No. 14/581,639, filed Dec. 23, 2014, which claims priority under 35 U.S.C. § 119 to Japanese Patent Application No. 2013-266464 filed on Dec. 25, 2013, and Japanese Patent Application No. 2014-259029 filed on Dec. 22, 2014. The contents of these applications are incorporated herein by reference in their entirely.

BACKGROUND

1. Technical Field

The present disclosure relates to a light emitting device having a semiconductor light emitting element and a resin layer having an inner conductive member.

2. Background Art

Light emitting devices using a semiconductor light emitting element (light emitting element) such as a light emitting diode can be easily downsized and can attain high luminous efficiency, which allows for the use in wide range of applications. The light emitting devices using a light emitting element are roughly classified into two types: a face-up type in which a light emitting element is provided with pad electrodes on a surface opposite side of the mounting substrate, and a face-down type in which the electrodes are provided on a lower surface of a light emitting element which faces the mounting substrate.

In the face-up type, the light emitting element is mounted on leads etc., and the light emitting element and the leads are respectively connected with a bonding wire or the like. Due to this configuration, when the light emitting element is mounted on the mounting substrate, in a plan view seen from a vertical direction to the surface of the mounting substrate, a portion of the bonding wire is needed to be the outer side of the light emitting element, which limits the downsizing.

On the other hand, in the face-down type (which typically employs a flip-chip configuration), the pad electrodes disposed on the light emitting element and the conductive pattern disposed on the mounting substrate can be electrically connected with the use of a connecting means such as bumps or metal pillars which are located on an inner side than the light emitting element in a plan view seen from a vertical direction to the surface of the mounting substrate. This configuration allows downsizing of the light emitting device (particularly the dimensions in a plan view seen from a vertical direction to the mounting surface of the mounting substrate). to a degree that is close to the size of the light emitting element chip.

Recently, in order to facilitate further downsizing or to obtain further increase in the luminous efficiency, the light emitting devices of face-down type have been used, in which respectively the growth substrate (light-transmissive substrate) such as a sapphire substrate has been removed, or the thickness of the growth substrate has been reduced.

The growth substrate is used to allow growing an n-type semiconductor layer and a p-type semiconductor layer which are constituent components of a light emitting element on its surface, and also has a function of improving the strength of the light emitting device by supporting the light emitting element which has a small thickness and low mechanical strength. Thus, in a light emitting device in which after forming the light emitting element, the growth substrate is removed or the thickness of the growth substrate is reduced, for example, as shown in JP 2010-141176A, a resin layer is provided at the electrode side (a side facing the mounting substrate) to support the light emitting element, and metal pillars which penetrate the resin layer are formed, and through the metal pillars, the electrodes of the light emitting element and the conductive pattern disposed on the mounting substrate are electrically connected. With such a resin layer which contains such metal pillars, the light emitting device can be secured with sufficient strength.

On the other hand, although it is not a light emitting element, for example, JP H05-299530A and JP 2008-251794A respectively describe a method of using a metal wire, connecting a conductive pattern of a mounting substrate and a terminal for external connection disposed on a surface of the resin layer.

RELATED ART DOCUMENT

Patent Literature

See Patent Literature 1: JP 2010-141176A.
See Patent Literature 2: JP H05-299530A.
See Patent Literature 3: JP 2008-251794A.

In such a configuration described above, in order to provide sufficient strength to the light emitting device, the resin layer may be needed to have a sufficient thickness of, for example, several tens of micrometers or greater or 1 mm or greater. Accordingly, the metal pillars may also be needed to have a thickness of several tens of micrometers or greater or 1 mm or greater. On the other hand, the metal pillars as illustrated in JP 2010-141176A are generally formed by using electrolytic plating, which requires a long period of time to form such thick pillars (metal layers), which results in a decrease in mass productivity. Further, in the case where a plated layer is formed thick, warpage is likely occur in the plated layer due to stress between the resin layer and the plated layer and to internal stress within the plated layer. As a result, detachment of the plated layer from the light emitting element may occur, or manufacturing of the light emitting device with a constantly stable shape may not be able to achieve.

For this reason, in place of the metal pillars, metal wires may be considered to be used, with applying a method described in JP H05-299530A or JP 2008-251794A. With the thickness of the resin layer within such a range as described above, the inner conductive member can be formed by simply changing the length of the metal wires, and substantially without changing the productivity.

On the other hand, light emitting elements are known to produce a large quantity of heat and their light-emitting output decrease with the rise in temperature. For this reason, the heat generated in the light emitting elements is needed to be quickly discharged to prevent excessive rise in the temperature. The thicker the resin layers of the support member, the longer metal wires are needed. However, generally, the metal wires are thinner than the metal pillars formed by using an electrolytic plating, so that the longer the length of the metal layer the greater the thermal resistance will be, resulting in a decrease of the heat dissipation performance through the metal wire as the heat conduction path. As a result, the emission output of the light emitting device decreases with an excessive rise in the temperature of the light emitting element.

SUMMARY

Accordingly, an aim of the embodiments of the present disclosure is to provide a light emitting device which has good balance between the productivity and heat dissipation performance.

In order to solve the disadvantages described above, a light emitting device according to an embodiment of the present invention may include a semiconductor light emitting element, a resin layer, an electrode for p-side external connection, an electrode for n-side external connection, a p-side inner wiring, and an n-side inner wiring. The semiconductor light emitting element may include a semiconductor stacked layer body constituted with stacking a p-type semiconductor layer and an n-type semiconductor layer and a p-side electrode electrically connected the p-type semiconductor layer and an n-side electrode electrically connected to the n-side electrode at one surface side of either a surface side disposed with the p-type semiconductor layer or a surface side disposed with the n-type semiconductor layer of the semiconductor stacked layer. The resin layer is disposed on the one surface side of the semiconductor stacked layer body. The electrode for p-side external connection is disposed exposed on a surface of the resin layer and an electrode for an n-side external connection is disposed exposed on a surface of the resin layer. The p-side inner conductive member is disposed in the resin layer to electrically connect the p-side electrode and the electrode for p-side external connection, and the n-side inner conductive member is disposed in the resin layer to electrically connect the n-side electrode and the electrode for n-side external connection. The p-side inner conductive member and the n-side inner conductive member respectively include a metal plating layer and a metal wire, or a metal plating layer and a metal wire bump.

In the light emitting device according to the embodiments of the present invention, a metal plated layer and a metal wire or a metal wire bump are used in combination in the inner conductive members of the support member, thus, deformation of the metal plating layer can be suppressed and/or an increase in time of manufacturing can be controlled, and also an increase in the thermal resistance due to the metal wire or metal wire bump can also be suppressed.

BRIEF DESCRIPTION OF THE DRAWINGS

FIG. 1A is a schematic perspective view illustrating a configuration of a light emitting device according to a first embodiment of the present invention.

FIG. 1B is a schematic plan view illustrating a configuration of a light emitting device according to a first embodiment of the present invention.

FIG. 5 is a flowchart showing the flow of operations of manufacturing a light emitting device according to a first embodiment of the present invention.

FIG. 13A is a schematic cross sectional view illustrating formation of a stacked bump.

FIG. 13B is a schematic cross sectional view illustrating bonding of a metal wire.

DETAILED DESCRIPTION OF THE INVENTION

Figure 1C:
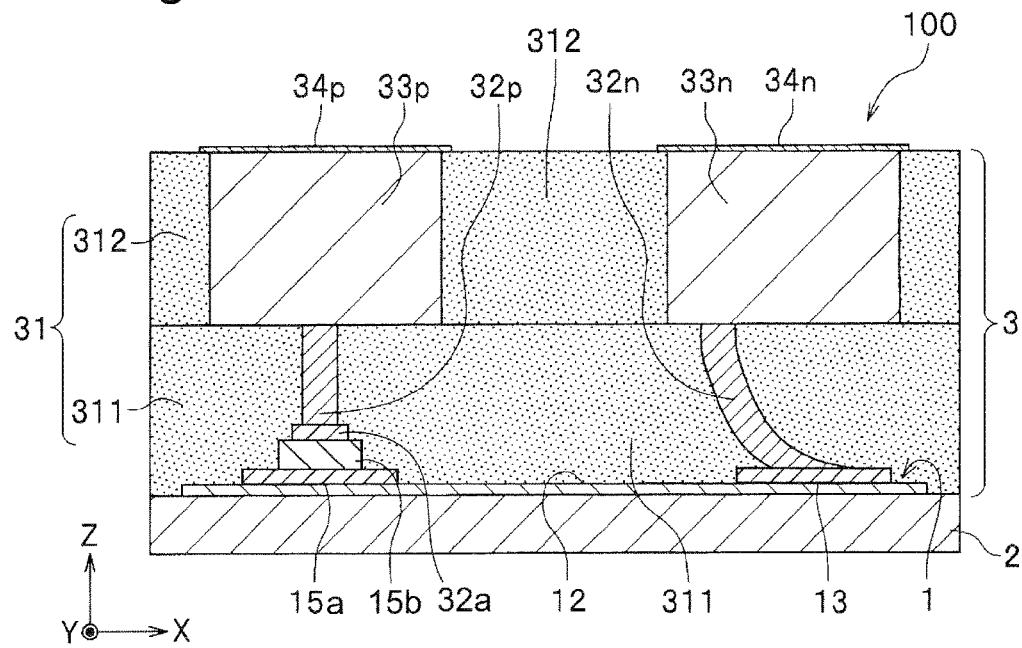
FIG. 1C is a schematic cross sectional view taken along line A-A of FIG. 1B.

A light emitting device and a method of manufacturing the light emitting device according to the embodiments of the present invention will be described below. The drawings referred to in the description below are to schematically illustrate the embodiments, and the size, a space or interval, locational relationship of the components may be exaggerated or a portion of a component may not be shown. Also, the size and/or space or interval of components may not be the same between a plan view and its corresponding cross-sectional view. In the description below, the same designations or the same reference numerals denote the same or like members and duplicative descriptions will be appropriately omitted.

In the light emitting device according to each embodiment of the present invention, a relative location expressed as "upper" and "lower", "left" and "right" or so forth may be vice versa, depends on the situation. In the present specification, the terms such as "upper" and "lower" are used to illustrate a relative locational relationship between the components in a drawing which is referred to, and unless specifically indicated, are not intended to show absolute positional relationship.

First Embodiment

Configuration of Light Emitting Device

With referring to FIG. 1A to FIG. 1D, a structure of a light emitting device according to a first embodiment will be described. A light emitting according to the first embodiment is constituted with, as shown in FIG. 1A to FIG. 1D, a semiconductor light emitting element 1 (hereinafter may be referred to as "light emitting element") having an LED—(light emitting diode)—structure in which a growth substrate is removed, a support member 3 disposed on one surface side of the light emitting element 1, and a fluorescent material layer (wavelength converting layer) 2 disposed on other side of the light emitting element 1. On the one surface side of the light emitting element 1, an n-side electrode 13 and a p-side electrode 15 are disposed, and through the metal wires 32n, 32p and the metal plated layer 33n, 33p which serve as inner conductive members, the n-side electrode 13 and the p-side electrode 15 are connected to the electrode for n-side external connection 34n and the electrode for p-side external connection 34p, respectively. The light emitting device 100 is produced in a wafer state, which is then singulated to obtain individual light emitting devices 100, the detail of which will be described below.

Also, the light emitting device 100 of the present embodiment is configured to emit light whose wavelength has been converted by a fluorescent material layer 2 which converts a portion of or the entire of the light emitted from the light emitting element 1 into light of a different wavelength, and emit the wavelength-converted light and light emitted from the light emitting element 1. For example, with configuring so that the light emitting element 1 emits blue light and the fluorescent material layer 2 absorbs a portion of the blue light to convert it in a yellow light, the light emitting device 100 can be a white light source to emit white light made by mixing the blue light and the yellow light. In the present embodiment and other embodiment to be described below, the light emitting device 100 is provided with a fluorescent material layer 2, but such a fluorescent material layer 2 is not indispensable, and may not be employed.

In the present specification, as indicated with the coordinate axes shown in the appropriate drawings, for convenience of illustration, a normal direction of the surface provided with the n-side electrode 13 and the p-side electrode 15 of the light emitting element 1 is indicated as "+Z-axis direction" and "a plan view" is indicated as looking in the direction from +Z-axis to −Z-axis. In the light emitting element 1 which has a rectangular shape in a plan view, the longitudinal direction is indicated as an x-axis direction and the lateral direction is indicated as a y-axis direction. Also, the figures indicated as "cross sectional" each shows a cross section at a plane substantially perpendicular to an X-Y plane (a plane substantially in parallel to an X-Z plane or a Y-Z plane).

Next, the structure of the light emitting device 100 will be described with reference to the drawings. The light emitting element 1 has a planar shape which is approximately rectangular in a plan view, and is an LED chip of a face-down type with the n-side electrode 13 and the p-side electrode 15 disposed on one surface side.

Example of Light Emitting Element

With referring to FIG. 2A and FIG. 2B, an example of light emitting element 1 will be described in detail below. The light emitting element 1 shown in FIG. 2A and FIG. 2B has a semiconductor stacked layer body 12 in which an n-type semiconductor layer 12n and a p-type semiconductor layer 12p are stacked. The semiconductor stacked layer body 12 is configured to emit light upon applying electric current between an n-side electrode 13 and a p-side electrode 15, and a light emitting layer 12a is preferably disposed between the n-type semiconductor layer 12n and the p-type semiconductor layer 12p. Also, at one surface side of a surface side disposed with the p-type semiconductor layer 12p or a surface side disposed with the n-type semiconductor layer 12n of the semiconductor stacked layer 12, the p-side electrode 15 which is electrically connected to the p-type semiconductor layer 12p and the n-side electrode 13 which is electrically connected to the n-type semiconductor layer 12n are provided. In the example shown in FIG. 2A and FIG. 2B, the p-side electrode 15 and the n-side electrode 13 are disposed at a side (the upper surface side in FIG. 2B) which is provided with the p-type semiconductor layer 12p of the semiconductor stacked layer body 12.

The semiconductor stacked layer body 12 has at least one region in which the p-type semiconductor layer 12p and the light emitting layer 12a are absent, that is a region recessed from the surface of the p-type semiconductor layer 12p (hereinafter may be referred to as "step portion 12b" is formed. The floor of the step portion 12b is an exposed surface of the n-type semiconductor layer 12n and the n-side electrode 13 is disposed on the step portion 12b. Also, a whole surface electrode 14 is disposed on an approximately entire surface of the upper surface of the p-type semiconductor layer 12p. The whole surface electrode 14 may be constituted with a reflecting electrode 14a which has a good reflecting property and a cover electrode 14b which covers entire of the upper surface and side surfaces of the reflecting electrode 14a. In addition, the p-side electrode 15 is disposed on a portion of the upper surface of the cover electrode 14b. Also, the surfaces of the semiconductor stacked layer body 12 and the whole surface electrode 14 are covered with an insulating protective layer 16 except the surfaces of the n-side electrode 13 and the p-side electrode 15 which are the pad electrodes of the light emitting element 1.

Also, the semiconductor stacked layer body 12 can be made of a material which is suitable to a semiconductor light emitting element, such as GaN, GaAs, AlGaN, InGaN, AlInGaO, GaP, SiC, or ZnO. In the present embodiment, a portion of light emitted from the light emitting element 1 is converted to light having a different wavelength by the fluorescent material layer 2, so that a semiconductor stacked layer body 12 which is configured to emit light of a shorter wavelength such as blue light or green light is suitable.

For the n-type semiconductor layer 12$n$, the light emitting layer 12$a$, and the p-type semiconductor layer 12$p$, a GaN-based compound semiconductor such as $In_XAl_YGa_{1-X-Y}N$ ($0 \leq X$, $0 \leq Y$, $X+Y \leq 1$) can be suitably used. Those semiconductor layers may respectively have a single-layer structure, but have a stacked-layer structure, a superlattice structure, or the like, which are made of layers of different compositions and thickness. Particularly, the light emitting 12$a$ preferably has a single quantum well structure or a multiquantum well structure which is made of stacked layer of thin layers each can produce quantum effect.

In the case where a GaN-based compound semiconductor is used for the semiconductor stacked layer body 12, the semiconductor layer can be formed on a growth substrate 11 (FIG. 6A) which is suitable for growing a crystal of a semiconductor layer, by using a known technique such as a MOCVD method (metal organic vapor phase epitaxy method), an HVPE method (hydride vapor phase epitaxy method), a MBE method (molecular beam epitaxy method). The thickness of the semiconductor layers are not specifically limited and various thickness can be applied.

For the grows substrate for epitaxially growing the semiconductor stacked layer body 12, in the case where a semiconductor stacked layer body 12 is formed by using nitride semiconductors such as GaN (gallium nitride) for example, an insulating substrate such as a sapphire with a principal plane being C-plane, R-plane, or A-plane, and a spinel ($MgAl_2O_4$); and silicon carbide (SiC), silicon, ZnS, ZnO, GaAs, and diamond, and an oxide substrate such as lithium niobate and neodymium gallate can be used.

In the present embodiment, during the manufacturing of the light emitting device 100, the growth substrate is peeled off from the semiconductor stacked layer body 12 to be removed. Thus, the light emitting element 1 in a completed light emitting device 100 does not include a growth substrate. The lower surface of the semiconductor stacked layer body 12 from which the growth substrate has been removed, that is, the lower surface of the n-type semiconductor layer 12$n$ preferably has a recess-projection shape 12$c$ formed by roughening the lower surface. With the recess-projection shape 12$c$, the light extraction efficiency of the surface can be improved. Such a recess-projection shape 12$c$ can be formed by performing wet etching on the lower surface of the n-type semiconductor layer 12$n$.

The whole surface electrode 14 serves as a current diffusion layer and a reflecting layer and may be constituted with stacking a reflecting electrode 14$a$ and a cover electrode 14$b$. The reflecting electrode 14$a$ is disposed to cover an approximately entire surface of the upper surface of the p-type semiconductor layer 12$p$. Also, the cover layer 14$b$ is disposed to cover entire of the upper surface and side surfaces of the reflecting electrode 14$a$. The reflecting electrode 14$a$ is a conductive layer for dispersing electric current supplied through the cover electrode 14$b$ and the p-side electrode 15 disposed on a portion of the cover electrode 14$b$ to the entire surface of the p-type semiconductor layer 12$p$. Also, the reflecting electrode 14$a$ has a good reflecting property and serves as a reflecting layer for reflecting the light emitted from the light emitting element 1 toward the light extracting surface. In the specification, the expression "having reflecting property" refers to satisfactory reflecting light of the wavelength of emission of the light emitting element 1. Further, the reflecting electrode 14$a$ preferably has a reflecting property to light of the wavelength which is converted by the fluorescent material layer 2.

For the reflecting electrode 14$a$, a metal material which has good electrical conductivity and good reflecting property can be used. For the metal material which has good reflecting property particularly in a visible region include Ag, Al or an alloy whose main component is one or more of those metals can be suitably used. For the reflecting electrode 14$a$, a single layer or stacked layer of those metal materials can be employed.

The cover electrode 14$b$ serves as a barrier layer for preventing migration of the metal material which is a constituent of the reflecting electrode 14$a$. Particularly, in the case where Ag which easily migrates is used for the reflecting electrode 14$a$, the cover electrode 14$b$ is preferably provided. For the cover electrode 14$b$, a metal material which has good electrical conductivity and good barrier property can be used, and examples of such a metal material include Al, Ti, W, and Au. For the cover electrode 14$b$, a single layer or stacked layer of those metal materials can be employed.

The n-side electrode 13 is disposed on the floor of the step portion 12$b$ of the semiconductor stacked layer body 12 where the n-type semiconductor layer 12$n$ is exposed. In addition, the p-side electrode 15 is disposed on a portion of the upper surface of the cover electrode 14$b$. The n-side electrode 13 and the p-side electrode 15 are pad electrodes. The n-side electrode 31 is electrically connected to the n-type nitride semiconductor layer 12$n$, and the p-side electrode 33 is electrically connected to the p-type nitride semiconductor layer 12 via a whole surface electrode 14, to supply external electric current to the nitride semiconductor element 1. To the n-side electrode 13 and the p-side electrode 15, a metal wire 32$n$ and a metal wire 32$p$ which are inner conductive member in the supporting body 3 (FIG. 1A to FIG. 1D) are respectively connected.

Figure 2A:
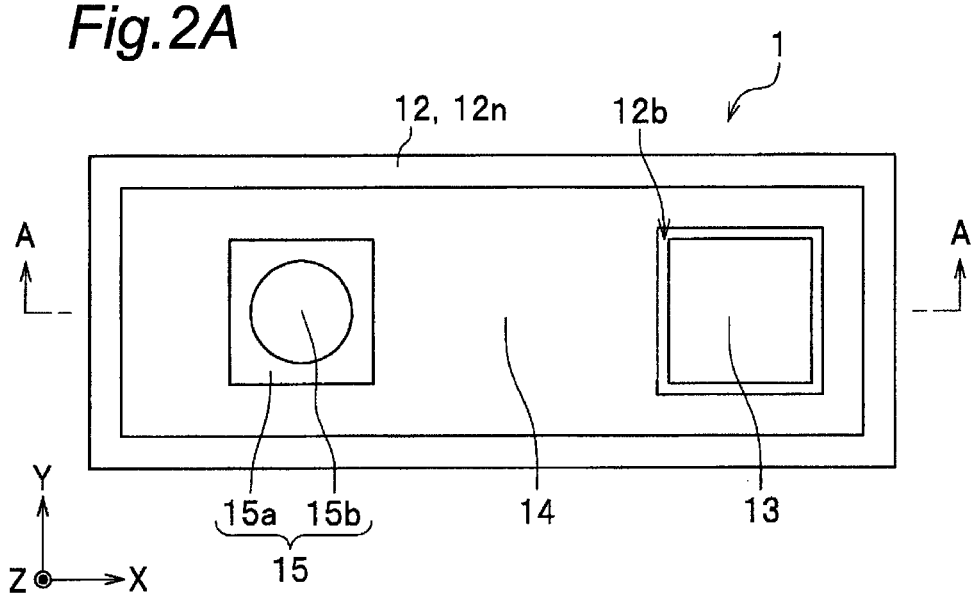
FIG. 2A is a schematic plan view illustrating a configuration of a light emitting element according to a first embodiment of the present invention.
Figure 2B:
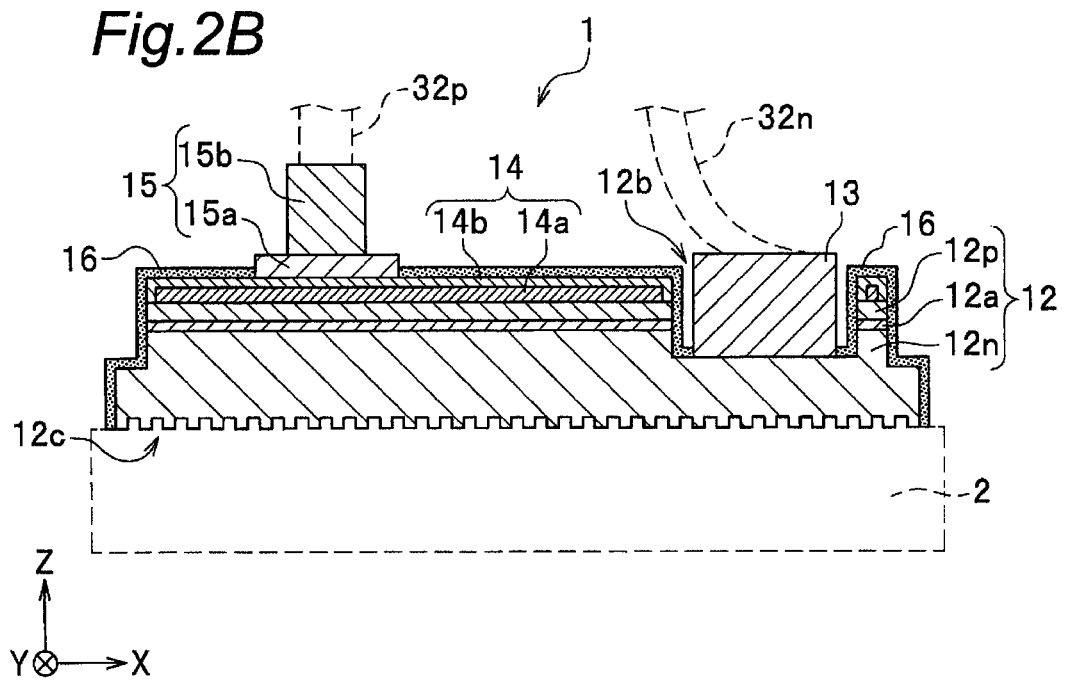
FIG. 2B is a schematic cross sectional view taken along line A-A of FIG. 2A.

Also, the example shown in FIGS. 2A and 2B, the p-side electrode 15 is constituted with a stack of the pad electrode layer 15$a$ which is originally a pad electrode and an impact absorbing layer 15$b$. The impact absorbing layer 15$b$ is not an essential component, but is employed to reduce the impact at the time of wire bonding the metal wire 32$p$ to reduce damage of the semiconductor stacked layer body 12. In the example shown in FIGS. 2A and 2B, in the case where ball bonding is employed for wire bonding as in the p-side electrode 15, the impact imposed on the bonding portion is relatively large. Therefore, the impact absorbing layer 15$b$ is preferably provided. The n-side electrode 13 may also be provided with an impact absorbing layer as in the p-side electrode 15. Also, without providing the p-side electrode 15, a portion of the whole surface electrode 14 may be used as a pad electrode and the metal wire 32$p$ may be directly connected to the whole surface electrode 14.

A metal material can be used for the n-side electrode 13 and the pad electrode layer 15$a$, and for example, a single metal member such as Ag, Al, Ni, Rh, Au, Cu, Ti, Pt, Pd, Mo, Cr or W, or an alloy whose main component is one or more of those metals can be suitably used. In the case where an alloy is used, for example as in an AlSiCu alloy, a nonmetallic element such as Si may be contained as a composition element. For the n-side electrode 13 and the pad electrode 15$a$, a single layer or stacked layer of those metal material can be employed. The impact absorbing layer 15$b$ is provided to absorb impact at the time of wire bonding for example, and a similar material as used for the pad electrode layer 15a can also be used, but it is suitable to use a material which can establish good connection with the metal wire 32p to be connected on the upper surface of the impact absorbing layer 15b. In order to absorb impact, the impact absorbing layer 15b preferably has a thickness of about 3 μm to 50 μm, more preferably about 20 μm to 30 μm. For example, in the case where the metal wire 32p is made of Cu, it is preferable that the impact absorbing layer 15b is also employs Cu.

The protective layer 16 has an insulating property and covers the entire of the upper surface and the side surfaces of the light emitting element 1 except for the connection parts of the n-side electrode 13 and the p-side electrode 15 to outside. The protective layer 16 serves as a protective layer and an antistatic layer for the light emitting element 1. In the case where a reflecting layer is disposed on the outside of the protective layer 16 which is disposed on the side surface portion of the semiconductor stacked layer structure body 12, the protective layer 16 preferably has good light transmissive property to the light emitted from the light emitting element 1. Further, it is also preferable that the protective layer 16 has good light-transmissive property to light of the wavelength which is converted by the fluorescent material layer 2. For the protective layer 16, a metal oxide or a metal nitride can be used, for example, an oxide or a nitride of at least one element selected from the group consisting of Si, Ti, Zr, Nb, Ta, and Al can be suitably used.

Also, for the protective layer 16, two or more types of light-transmissive dielectric member with different refractive indices may be stacked to constitute a DBR (Distributed Bragg Reflector) layer. With the DBR layer, leaking light from the upper surface and the side surfaces of the light emitting element 1 can be reflected and returned into the light emitting element 1, so that the light extraction efficiency of the lower surface which is the light extracting surface of the light emitting element 1 can be improved. Examples of the DBR layer includes a multilayer film in which a $SiO_2$ layer and a $Nb_2O_5$ layer are alternately stacked, in which, good reflectance can be obtained with a multilayer of at least three pairs or more, preferably seven pairs or more.

Other Examples of Light Emitting Element

Next, with referring to FIG. 3A to FIG. 4B, other examples of light emitting element will be described in detail. The same reference numerals will be applied to the components which have the same or similar structure as those shown in FIGS. 2A and 2B and descriptions thereof will be appropriately omitted.

The light emitting element 1A of another example shown in FIGS. 3A, 3B, 4A, and 4B has a configuration in which the p-side electrode 15 which is the p-side pad electrode is disposed extending on a portion of the upper surface of the whole surface electrode 14, and the n-side electrode 13 which is the n-side pad electrode is disposed, except for the region where the p-side electrode is disposed and a portion close thereto, on approximately entire of the upper surface and the side surfaces of the semiconductor stacked layer body 12 via the protective layer 16. Thus, providing the n-side electrode 13 or the p-side electrode 15 on a wide area of the upper surface and the side surfaces of the light emitting element 1A allows for conducting heat efficiently to the resin layer 31 of the support member 3 to be described below, so that heat dissipation performance can be improved. In the example shown in FIGS. 3A, 3B, 4A, and 4B, the n-side electrode 13 is disposed extending on a wide area of the upper surface and the side surfaces of the semiconductor stacked layer body 12, but alternatively, the p-side electrode 15 may be provided on a wide area. Also, both the n-side electrode 13 and the p-side electrode 15 may be disposed complementarily on a wide area. For example, in FIG. 3A, the p-side electrode 15 may be disposed on a wide area of a left half of the light emitting element 1A and the n-side electrode 13 may be disposed on a wide area of a right half of the light emitting element 1A.

The n-side electrode 13 and/or the p-side electrode 15 may be disposed extending to the side surfaces of the semiconductor stacked layer body 12 where the reflecting electrode 14a is not provided, so as to function as a reflecting layer. With the DBR layer, leaking light from the upper surface and the side surfaces of the light emitting element 1 can be reflected and returned into the semiconductor stacked layer body 12, so that the light extraction efficiency of the lower surface which is the light extracting surface of the light emitting element 1 can be improved. In the case where the n-side electrode 13 and/or the p-side electrode 15 is used as a reflecting layer, a material having good reflectivity is preferably used for at least a lower layer side (protective layer 16 side) of the electrode. Examples of the material which has good reflecting property to visible light include Ag, Al or an alloy whose main component is one or more of those metals.

In the light emitting element 1A, the step portion 12b where the n-type semiconductor layer 12n is exposed is formed on the entire periphery of the semiconductor stacked layer body 12. Also, a whole surface electrode 14 which is a stacked layer of the reflecting electrode 14a and the cover electrodec 14b is disposed on an approximately entire surface of the upper surface of the p-type semiconductor layer 12p of the semiconductor stacked layer body 12. Also, the surfaces of the semiconductor stacked layer body 12 and the whole surface electrode 14 are covered with an insulating protective layer 16 except for the entire of the lower surface of the semiconductor stacked layer 12, a portion of the floor of the step portion 12b, and a portion of the upper surface of the whole surface electrode 14. also, in the light emitting element 1A, in a similar manner as in the light emitting element 1, a recess-projection shape 12c is formed on the entire surface of the lower surface of the n-type semiconductor layer 12n.

Figure 3A:
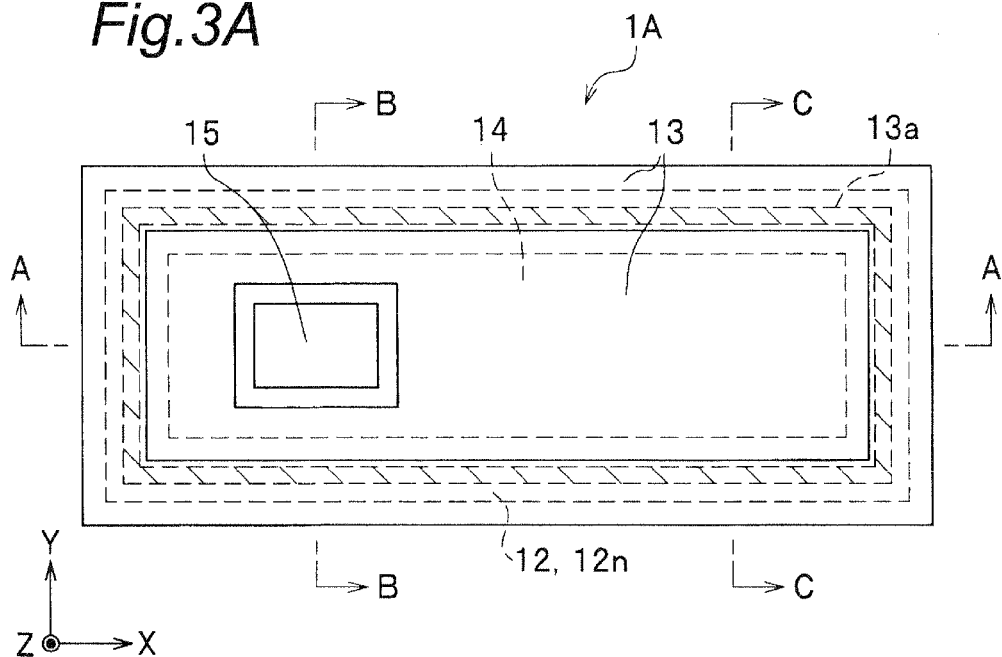
FIG. 3A is a schematic plan view illustrating another example of a configuration of a light emitting element according to a first embodiment of the present invention.
Figure 3B:
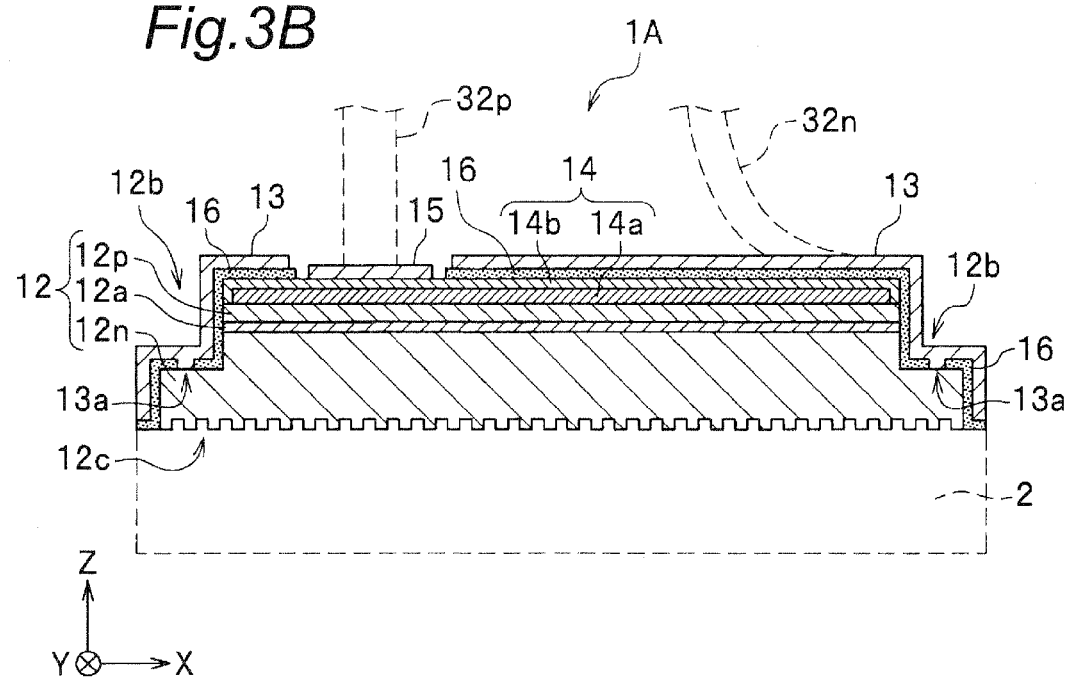
FIG. 3B is a schematic cross sectional view taken along line A-A of FIG. 3A.
Figure 4A:
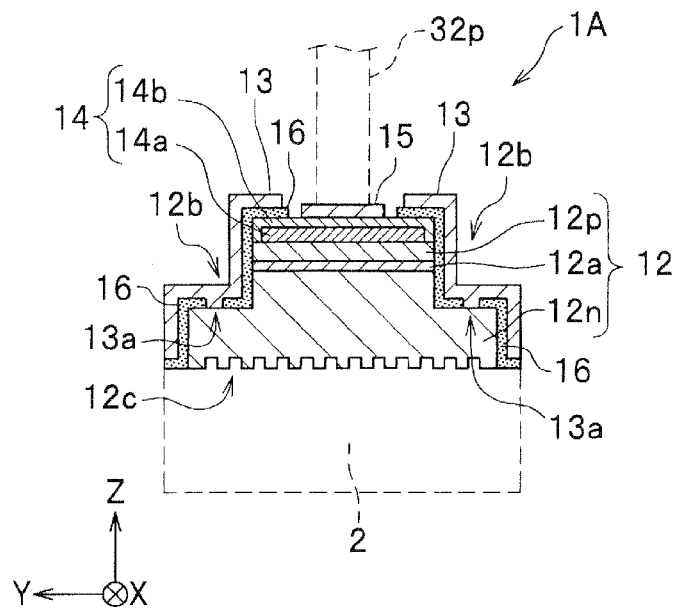
FIG. 4A is a schematic cross sectional view taken along line B-B of FIG. 3A.
Figure 4B:
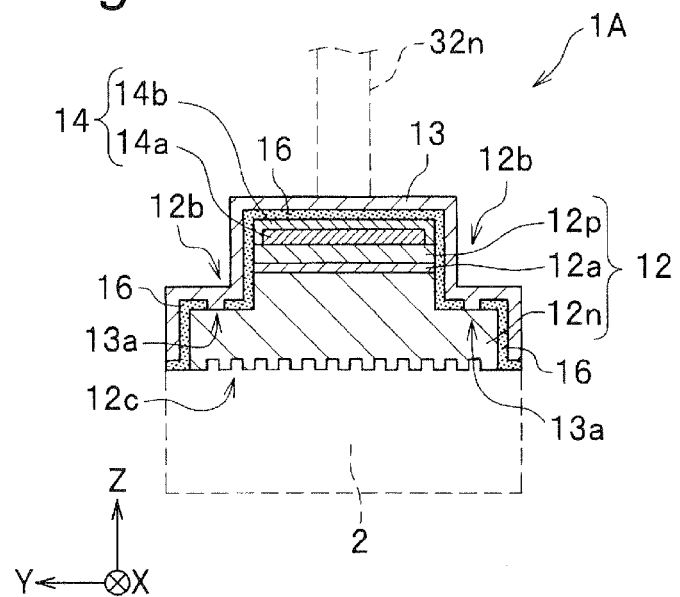
FIG. 4B is a schematic cross sectional view taken along line C-C of FIG. 3A.

Also, at the floor of the step portion 12b, as shown in FIG. 3B and FIGS. 4A and 4B, the protective layer 16 has opening portions. That is, the opening portions are the regions where the n-type semiconductor layer 12n is not covered with the protective layer 16, and the opening portions serves the joining portions 13a of the n-type semiconductor layer 12n and the n-side electrode 13. In the present example, as shown in FIG. 3A, the joining portion 13a is disposed along the whole circumference of the semiconductor stacked layer body 12. As described above, providing the joining portion 13a in a wide area allows for uniform dispersion of the electric current which is supplied through the n-side electrode into n-type semiconductor layer 12n, so that the luminous efficiency can be improved.

Instead of forming the step portion 12b around the entire periphery of the semiconductor stacked layer body 12, the step portion 12b may be formed at a portion of the periphery. Reduction of the region to form the step portion 12b allows for increase of the area for the p-type semiconductor layer 12p and the light emitting layer 12a, so that the light emission quantity can be increased. Alternative to or in addition to the periphery, the step portion 12b may be formed inner side of the semiconductor stacked layer body 12 in a plan view. Forming the step portion 12*b* intermittently in a wide area rather than forming the step portion in a part of the semiconductor stacked layer structure body allows for uniform dispersion of the electric current in the n-type semiconductor layer as described above, without excessive increase of the step portion 12*b* area. Instead of forming the step portion 12*b* around the entire periphery of the semiconductor stacked layer body 12, the step portion 12*b* may be formed at a portion of the periphery.

Also, in the light emitting device 100 (referring FIG. 1A to FIG. 1D) of the present embodiment, for convenience of illustration, a light emitting element 1 is described as the light emitting element, but any of the light emitting element 1 shown in FIGS. 2A and 2B, and the light emitting element 1A shown in FIG. 3A to FIG. 4B can also be employed. In a similar manner, in other embodiments to be described below, any of the light emitting element 1 and the light emitting element 1A can be employed.

Now returning to FIG. 1A to FIG. 1D, a structure of the light emitting device 100 will be described. The fluorescent material layer (wavelength converting layer) 2 absorbs a portion of or the entire portion of light emitted from the light emitting element 1 and converts it to light of a different wavelength. The fluorescent material layer 2 can be formed of a resin layer containing particles of a fluorescent material as a wavelength converting material. The fluorescent material layer 2 may be disposed, as shown in FIG. 1C, at a lower surface side of the n-type semiconductor layer 12*n* which is the light extracting surface of the light emitting element 1 and which is provided with a recess-projection shape 12*c* (FIG. 2B).

The thickness of the fluorescent material layer 2 can be determined according to the content of the fluorescent material, a desired color tone of mixed light of the light emitted from the light emitting element 1 and the wavelength-converted light, and so forth. For example, the thickness of the fluorescent material layer 2 may be 1 to 500 μm, more preferably 5 to 200 μm, and further preferably 10 to 100 μm, The content of the fluorescent material in the fluorescent material layer 2, as a weight per unit volume, is preferably adjusted to 0.1 to 50 mg/cm$^3$. With the content of the fluorescent material in this range allows for sufficient color conversion.

A resin material having good light-transmissive property to light emitted from the light emitting element 1 and the light whose wavelength has been converted by the fluorescent material layer 2 is preferably used. Examples of such a resin material include a silicone resin, a modified silicone resin, an epoxy resin, a modified epoxy resin, a urea resin, a phenol resin, an acrylate resin, a urethane resin, a fluororesin, or a hybrid resin containing one or more of those resins.

The fluorescent material (wavelength converting material) is not specifically limited as long as it can be excited by the wavelength of the light emitted from the light emitting element 1 and emits light of a different wavelength than the wavelength of the exciting light, and a granular fluorescent material can be suitably employed. A granular fluorescent material has light scattering property and light reflecting property, so that it can serve as a light scattering member and thus light diffusing effect can also be obtained. It is preferable that the fluorescent material is approximately uniformly mixed in the fluorescent material layer 2 which is also a resin layer. Also, two or more fluorescent materials may be uniformly mixed in the fluorescent material layer 2 or may be distributed in a multilayer manner.

For the fluorescent material, a known material in the art can be used. Specific examples of the fluorescent materials include a YAG (yttrium aluminum garnet)-based fluorescent material activated with cerium, a LAG (lutetium aluminum garnet)-based fluorescent material activated with cerium, a nitrogen-containing calcium aluminosilicate (CaO—$Al_2O_3$—$SiO_2$)-based fluorescent material activated with europium and/or chromium, a silicate ($(Sr,Ba)_2SiO_4$)-based fluorescent material activated with europium, β-sialon-based fluorescent material, a KSF ($K_2SiF_6$:Mn)-based fluorescent material. Also, a quantum dot phosphor can be used.

Also, in order to add a light diffusing property to the fluorescent material layer 2, an inorganic filler made of particles of a light transmissive inorganic compound, for example, an oxide, a carbonate, a sulphate, or a nitride of a rare earth element such as Si, Al, Zn, Ca, Mg, and Y, or an element such as Zr, Ti, or a complex salt such as bentonite and potassium titanate may be added. The average particle size of such an inorganic filler may be similar to the average particle size of the fluorescent material described above.

The fluorescent material layer 2 can be formed by preparing a slurry in which a resin described above, particles of a fluorescent material, and other material such as an inorganic filler are contained in a solvent, applying the slurry on a lower surface of a semiconductor stacked layer body 12 with the use of a spray method, a cast method, a potting method or the like, then hardening the slurry applied. Also, the fluorescent material layer 2 can be formed by separately preparing a resin plate which contains particles of a fluorescent material and adhering the resin plate to a lower surface of the semiconductor stacked layer body 12.

Also, the light emitting device 100 may be configured such that, without forming the fluorescent material layer 2, the lower surface of the semiconductor stacked layer body 12 is designated to the light extracting surface, so that the light emitted from the light emitting element 1 can be directly discharged. Also, in place of the fluorescent material layer 2, without containing a fluorescent material, a light transmissive resin layer may be disposed, or a light transmissive resin layer which contains a light diffusing filler may be disposed.

The support member 3 has an approximately rectangular parallelepiped shape which in a plan view can contain the external shape of the light emitting element 1, and is disposed to join the light emitting element 1 at the surface side where the n-side electrode 13 and the p-side electrode 15 are disposed, and thus mechanically holds the light emitting element 1 from which the growth substrate is removed. In a plan view, the supporting member 3 has a shape approximately similar to the shape of the fluorescent material layer 2. The support member 3 includes a resin layer 31, electrodes for external connection (electrode for n-side external connection 34*n* and electrode for p-side external connection 34*p*) for mounting on a mounting substrate, and inner conductive members (metal wire 32*n*, 32*p* and metal plated layers 33*n*, 33*p*) for electrically connecting an n-side electrode 13 and a p-side electrode 15 to corresponding external connection electrodes respectively.

Figure 1D:
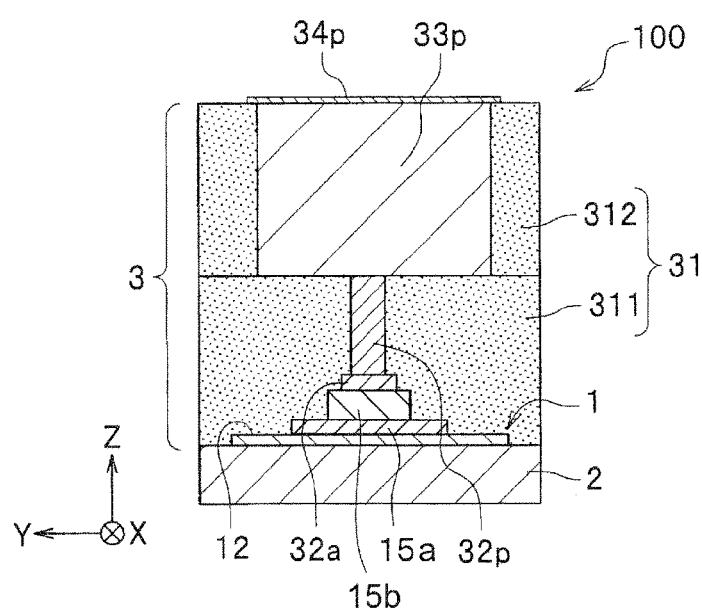
FIG. 1D is a schematic cross sectional view taken along line B-B of FIG. 1B.

The resin layer 31 a base material of a reinforcing member of the light emitting element 1. The resin layer 31 has an external shape, as shown in FIG. 1C and FIG. 1D, approximately similar to the external shape of the support member 3, and in a plan view, has an external shape which can contain the external shape of the light emitting element 1 and is approximately similar to the external shape of the fluorescent material layer 2. Also, the resin layer 31 serves as a sealing resin layer which seals the upper surface and the side surfaces of the light emitting element 1. Thus, all the surfaces of the light emitting element 1 are sealed with the resin layer 31 and the fluorescent material layer 2 which is a resin layer disposed on the lower surface side of the light emitting element.

The resin layer 31 is, as shown in FIG. 1C and FIG. 1D, constituted with two stacked layers of a first resin layer (wire embedding layer) 311 in which metal wires 32n, 32p each penetrating in the thickness direction (the Z-axis direction) and a second resin layer (plated layer embedding layer) 312 in which metal plated layers 33n, 33p each penetrating in the thickness direction are embedded. The first layer 311 and the second resin layer 312 are well adhered to each other and integrated to form the resin layer 31.

The resin material used for the first resin layer 311 and the second resin layer 312 may be different, but it is preferable to use the same material to obtain better adhesiveness. For the resin materials of the first resin layer 311 and the second resin layer 312, the resin materials similar to those of the fluorescent material layer 2 can be used. In the case where the first resin layer 311 and the second resin layer 312 are formed by way of compression molding, a raw material such as EMC (epoxy mold compound) which is a powdery epoxy-based resin or SMC (silicone mold compound) which is a powdery silicone-based resin can be suitably used.

In order to enhance thermal conductivity, a heat conducting member may be contained in the first resin layer 311 and the second resin layer 312. With enhancing thermal conductivity of the first resin layer 311 and the second resin layer 312, heat generated from the light emitting element 1 can be quickly conducted and released to the outside. For the thermally conducting member, for example, granular carbon black or AlN (aluminum nitride) can be used. In the case where the thermally conducting member has electrically conducting property, the thermally conducting member can be contained with a particle density in a range so that the first resin layer 311 and the second resin layer 312 do not exhibit electrical conductivity.

For the first resin layer 311 and the second resin layer 312, a white resin made of a light transmissive resin material contained with a reflecting filler may be used. With the use of a white resin at least for the first resin layer 311 which is joined to the upper surface of the light emitting element 1 so that the first resin layer 311 can serve as a light reflecting layer, leaking light from the upper surface and the side surfaces of the light emitting element 1 can be reflected and returned into the light emitting element 1, so that the light extraction efficiency of the lower surface which is the light extracting surface of the light emitting element 1 can be improved. In the case where the first resin layer 311 can serves as a light reflecting layer, the whole surface electrode 14 of the light emitting element 1 may be formed with a light-transmissive material such as ITO (indium tin oxide) or IZO (indium zinc oxide).

A lower limit for the thickness of the resin layer 31 can be determined so as to exhibit sufficient strength as a reinforcing member of the light emitting element 1 from which the growth substrate has been removed, and an upper limit for the thickness of the resin layer 31 can be determined in view of the thermal resistance of the inner conductive members made of the metal wires 32n, 32p and the metal plated layers 33n, 33p, and productivity of the metal plated layers 33n, 33p. For example, in the case where the light emitting element 1 has an external shape of about 1000 μm×500 μm in a plan view, the thickness of the resin layer 31 can be 50 μm or greater. In view of thermal resistance of the inner wirings made of the metal wire 32n, 32p and the metal plating layer 33n, 33p respectively, the thickness of the resin layer 31 is preferably about 1000 μm or less, and more preferably about 250 μm or less.

The metal wire 32n is disposed in the first resin layer 311 so as to penetrate in the thickness direction, and serves as an inner conductive member which electrically connects the n-side electrode 13 and the metal plating layer 33n. The metal wire 33n is disposed in the second resin layer 312 so as to penetrate in the thickness direction, and serves as an inner conductive member which electrically connects the metal wire 32n and the electrode for n-side external connection 34n. That is, the n-side electrode 13 of the light emitting element 1 is connected to the electrode for n-side external connection 34n by an inner conductive member which is made of the metal wire 32n and the metal plating layer 33n connected in series.

In a similar manner, the metal wire 32p is disposed in the first resin layer 311 so as to penetrate in the thickness direction, and serves as an inner conductive member which electrically connects the p-side electrode 15 and the metal plating layer 33p. Also, the metal wire 33p is disposed in the second resin layer 312 so as to penetrate in the thickness direction, and serves as an inner conductive member which electrically connects the metal wire 32p and the electrode for p-side external connection 34p. That is, the p-side electrode 15 of the light emitting element 1 is connected to the electrode for p-side external connection 34p by an inner conductive member which is made of the metal wire 32p and the metal plating layer 33p connected in series.

For the metal wires 32n, 33p, a material having good electric conductivity and good thermal conductivity is preferably used, and for example, Au, Cu, Al, or Ag, or an alloy whose main component is one or more of those metals can be suitably used. Also, a metal wire provided with a surface coating may be employed. In order to efficiently conduct heat generated from the light emitting element 1, the diameter of the wire is preferably about 20 μm or greater, more preferably about 30 μm or greater, thus, the larger the diameter of the wire is the more efficiently conducts the heat. The upper limit for the diameter of the wires is not specifically limited as long as the wire can be attached to the n-side electrode 13 and the p-side electrode 15 of the light emitting element 1, but preferably not to cause damage due to impact from the wire bonder experienced on the semiconductor stacked layer body 12 at the time of wire bonding. Thus, for example, the diameter of the wire may be preferably about 3 mm or less, and more preferably about 1 mm or less. In order to use a thicker wire at a lower price, a wire made of Cu or Al, or an alloy whose main component is one or more of those metals can be suitably used. The shape of the wire is not specifically limited, and in addition to the wires having a circular cross sectional shape, a ribbon shaped wires with, for example, an elliptical or a rectangular cross sectional shape may be used.

The wiring paths of the metal wires 32n, 32p are not specifically limited, but are preferably arranged to penetrate in the thickness direction with a shortest path or an approximately shortest path, respectively. In view of the thermal resistance of the metal wires 32n, 32p and the calorific value of the light emitting element 1, the length and the diameter of the metal wires 32n, 32p can be determined to prevent an excessive rise of the light emitting element 1.

Moreover, as in the present embodiment, with the use of the metal wires 32n, 32p as the first layer of the inner conductive member, the wiring path can be set with freedom, so that regardless of the positions of the n-side electrode 13 and the p-side electrode 15 of the light emitting element 1, connections with the n-side electrode 13 and the p-side electrode 15 can be easily established. Also, the distance between the metal layers 33n, 33p which is the second layer and the semiconductor stacked layer body 12 can be increased, so that effects of the internal stress from the metal plated layers 33n, 33p to the semiconductor stacked layer body 12 can be reduced. Accordingly, a risk of damage such as generation of cracks in the semiconductor stacked layer body 12 can be reduced.

As shown in FIG. 1C, the metal wire 32p in the present embodiment is connected to the p-side electrode 15 by wire bonding in a manner where an end surface of the wire is connected to the p-side electrode having an upper layer of an impact absorbing layer 15b for absorbing impact at the time of wire bonding. For this reason, a bump 32a is formed at the tip of the metal wire 32p which is the joining portion with the p-side electrode 15. The metal wire 32n is connected to the n-side electrode 13 by wedge bonding in a manner where a side surface of the end portion of the wire is connected to the n-side electrode. That is, the metal wire 32n has a wedge-shaped end portion in one end and is connected to the n-side electrode 13 with the wedge-shaped end portion. The example shown in FIG. 1C illustrate an example of connecting method of wire and the method is not limited thereto. For example, at any electrodes, connection can be made by ball bonding, or made of wedge bonding. Further, the metal wire 32p can be connected to the p-side electrode 15 with the wedge-shaped tip portion formed at one end. Particularly, connecting with the use of wedge bonding, the metal wire 32 can be arranged in a curved state, so that the volume of metal present in the resin layer 31 can be increased. Accordingly, heat generated from the light emitting element 1 can be further efficiently conducted.

The metal plated layers 33n, 33p can be formed by using an electrolytic plating method, and a metal material having good electrical conductivity and good thermal conductivity is preferably used. Examples of such a metal material include Cu, Au, Ni, and Pd. Of those, Cu, which is an inexpensive and has relatively high electrical conductivity and thermal conductivity can be suitably used.

The metal plated layers 33n, 33p are preferably disposed so as to have better thermal conductivity than that of the metal wires 32n, 32p, thus, the two metal plated layers 33n, 33p are spaced apart from each other to a degree no to create short circuit, and in a plan view, disposed in the second resin layer 312 with each area as large as possible. Also, in the present example, the metal plated layers 33n, 33p which are the inner conductive members respectively have a quadratic prism shape with an approximately square shape in a plan view, but the shape is not limited thereto, a columnar shape, a polygonal columnar shape, a truncated cone shape, a truncated pyramid shape, or the like, can be employed.

The metal plated layers 33n, 33p can be formed by using an electrolytic plating with a thickness of about 50 to 150 μm through a single electrolytic plating operation in a case of Cu. An increase of the thickness of the plated layer liable to cause warpage of the plated layer due to the stress between the plated layer and the resin layer and/or to the internal stress. For this reason, the thickness of the plated layers 33n, 33p is preferably set to a thickness which can be obtained by plating operations of several times, or more preferably can be obtained by a single set of plating operation. Thus, the thickness of the metal plated layers 33n, 33p is preferably set to about 50 to 200 μm.

Also, the upper surface of the metal plated layers 33n 33p are arranged substantially in a same plane with the upper surface of the second resin layer 312. Then, the electrode for n-side external connection 34n is disposed on the upper surface of the entire upper surface of the metal plated layer 33n and extending on a part of the upper surface of the second resin layer 312 which is adjacent to the upper surface of the metal plated layer 33n. In a similar manner, the electrode for p-side external connection 34p is disposed on the upper surface of the entire upper surface of the metal plated layer 33p and extending on a part of the upper surface of the second resin layer 312 which is adjacent to the upper surface of the metal plated layer 33p.

The electrode for n-side external connection 34n and the electrode for p-side external connection 34p are pad electrodes for joining the light emitting device 100 to an external mounting substrate. The electrode for n-side external connection 34n and the electrode for p-side external connection 34p are disposed on a surface of the resin layer 31 at an opposite side of the surface which is joined with the light emitting element 1, that is, disposed on the upper surface of the resin layer 31. In the light emitting device 100, the upper surface side of the resin layer 31 is designated to the mounting surface, and with the use of an electrically conductive adhesive material such as a solder, the electrode for n-side external connection 34n and the electrode for p-side external connection 34p are joined to respective wiring patterns of a mounting substrate. In the present embodiment, the surface provided with the fluorescent material layer 2 serves as the light extracting surface, so that the light emitting device 100 is provided with the electrode for n-side external connection 34n and the electrode for p-side external connection 34p so as to be suitable for a top view type mounting.

For the electrode for n-side external connection 34n and the electrode for p-side external connection 34p, in order to enhance joining with a mounting substrate, for example, with the use of an Au alloy-based joining material such as Au—Sn eutectic solder, at least the uppermost layers are preferably made of Au. For example, in the case where the metal plated layers 33n, 33p are made of a metal such as Cu or Al which is other than Au, in order to improve adhesion with Au, it is preferable that thin layers of Ti and Ni are formed in this order by using a sputtering method and an Au layer is formed stacked on the Ni layer. The electrode for n-side external connection 24n and the electrode for p-side external connection 34p may have a total thickness of about 0.1 μm to about 5 μm, more preferably about 0.5 μm to about 4 μm.

In the case where the metal plated layers 33n, 33p are made of Au, without providing the electrode for n-side external connection 34n and the electrode for p-side external connection 34p, the metal plated layers 33n, 33p can be also designated to serve as the pad electrodes and their upper surfaces can be used for connecting surfaces to the outside. Also, the electrode for n-side external connection 34n and the electrode for p-side external connection 34p may be disposed on the entire or a part of the upper surface of the metal plated layers 33n, 33p, and not to disposed on the upper surface of the second resin layer 312, or the electrode for n-side external connection 34n and the electrode for p-side external connection 34p may be disposed extending onto the second resin layer 312, or further onto the side surfaces of the first resin layer 311. Disposing the electrode for n-side external connection 34n and the electrode for p-side external connection 34p extending onto the side surfaces of the resin layer 31 (in FIG. 1A to FIG. 1D, side surfaces in parallel to the X-Z plane, that is, in a plan view, the side surfaces which include the longitudinal sides)

allows the light emitting device 100 to be mounted on a mounting substrate as a side-view type light emitting device.

Operation of Light Emitting Device

Next, the operation of the light emitting device 100 will be described. For convenience of illustration, the light emitting element 1 is assumed to emit blue light and the fluorescent material layer 2 is assumed to emit yellow light below.

In the light emitting device 100, upon connecting an external power source between the electrode for n-side external connection 34n and the electrode for p-side external connection 34p via a mounting substrate, through the metal plated layers 33n, 33p and the metal wires 32n, 32p, electric current is supplied between the n-side electrode 13 and the p-side electrode 15 of the light emitting element 1. With the supply of electric current between the n-side electrode 13 and the p-side electrode 15, the light emitting layer 12a of the light emitting element 1 emits blue light.

The blue light emitted from the light emitting layer 12a of the light emitting element 1 propagates in the semiconductor stacked layer structure body 12 and discharged from the lower surface of the light emitting element 1. A portion of the discharged light is absorbed by the fluorescent material contained in the fluorescent material layer 2 and converted into a yellow light, then extracted to outside. Also, a portion of the blue light is transmitted through the fluorescent material layer 2 without absorbed by the fluorescent material, and then extracted to outside. The light propagating downward in the light emitting element 1 is reflected upward at the reflecting electrode 14a and is emitted from the upper surface of the light emitting element 1. Then, the yellow light and the blue light extracted to outside of the light emitting device 100 are mixed to produce a white light.

Method of Manufacturing Light Emitting Device

In the below, the light emitting device 1A will be described with reference to FIG. 5. As shown in FIG. 5, a method of manufacturing a light emitting device 100 includes, preparing light emitting element: S101, providing wiring: S102, forming first resin layer: S103, cutting first resin layer: S104, forming plated layer: S105, forming second resin layer: S106, cutting second resin layer: S107, disposing electrode for external connection: S108, removing growth substrate: S109, forming fluorescent material layer (forming wavelength converting layer: S110, and singulating: S111, which are performed in this order. Now, with reference to FIG. 6A through FIG. 9B, (also, appropriately referring to FIG. 1A to FIG. 1D, FIGS. 2A and 2B, and FIG. 5), each operation will be described in detail below. In each drawing of FIG. 6A to FIG. 9B, a detailed configuration of the light emitting element 1 (for example, a protective layer 16 and a stacking structure of a semiconductor stacked layer structure body 12) are omitted for ease of visualization. Also, the sizes and the arrangement relationships of other members may be appropriately simplified or exaggerated.

Figure 6A:
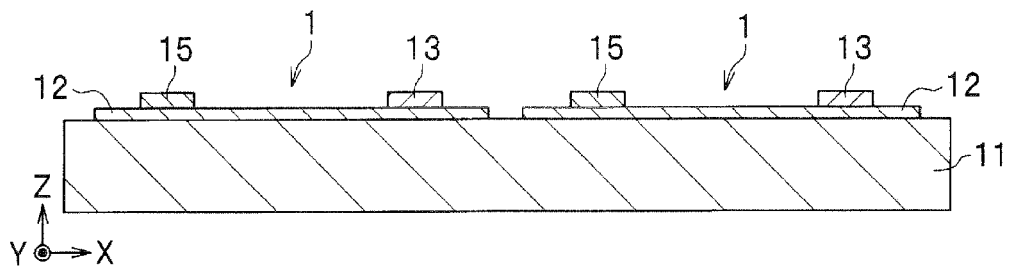
FIG. 6A to FIG. 6D are each a schematic cross sectional view showing a part of a manufacturing operations of a light emitting device according to a first embodiment of the present invention.

The preparing light emitting element: S101 includes preparing a light emitting element 1 having a configuration shown in FIGS. 2A and 2B. In the preparing light emitting element S101 of the present embodiment, a plurality of the light emitting elements 1 are fabricated on a growth substrate 11 in a state of wafer where they are disposed in arrays. In each drawing of FIG. 6A to FIG. 9B, the coordinate axes indicate a Z-axis which is the up/down direction, an x-axis which is the right/left direction, and a Y-axis which is a direction perpendicular to a plane of the figure, as shown in FIG. 6A. Also, the "up" direction is indicated as a +Z-axis direction. Each of FIG. 6A to FIG. 9B shows a cross sectional view taken along line A-A in the plan view shown in FIG. 1B.

More specifically, with the use of the materials described above, a semiconductor stacked layer body 12 is formed by stacking an n-type semiconductor layer 12n, a light emitting layer 12a, and a p-type semiconductor layer 12p in this order on an upper surface of a growth substrate 11 made of sapphire or the like. Upon forming the semiconductor stacked layer body 12, etching is carried out on a portion of the upper surface of the semiconductor stacked layer body 12 to remove the p-type semiconductor layer 12p, the active layer, and a portion of the n-type semiconductor layer 12n so as to create a step portion 12b in which the n-type semiconductor layer 12n is exposed at the floor.

At the same time of forming the step portion 12b, etching may be carried out on the border regions of adjacent light emitting elements 1 to expose the n-type semiconductor layer 12n. Thus, in a later operation in the preparing light emitting element: S101, at least a side surface which includes the light emitting layer 12a can be covered with a protective layer 16. Further, at the border regions, the semiconductor stacked layer body 12 may be entirely removed to expose the growth substrate 11. Thus, in the singulating: S111, dicing of the semiconductor stacked layer body 12 becomes unnecessary, so that singulating can be performed easily by dicing only a layer made of a resin. In the example shown in FIG. 6A, the semiconductor stacked layer body 12 in the border regions are completely removed.

Next, an n-side electrode 13 which serves as a pad electrode is disposed on the floor of the step portion 12b. Also, on the region to serve as the light emitting region which includes the p-type semiconductor layer 12p and the light emitting layer 12a, a whole surface electrode 14 constituted with a reflecting electrode 14a covering approximately entire upper surface of the p-type semiconductor layer 12p and a cover electrode 14b entirely covering the upper surface and the side surfaces of the reflecting electrode 14a is disposed. In addition, the p-side electrode 15 which is a pad electrode is disposed on a portion of the upper surface of the cover electrode 14b. Further, on the entire back surface of the wafer except for the surfaces of the n-side electrode 13 and the p-side electrode 15, for example, by way of sputtering and with the use of an insulating material such as $SiO_2$, a protective layer 16 is formed. As described above, as shown in FIG. 6A, light emitting elements 1 in a wafer state are fabricated.

Figure 6B:
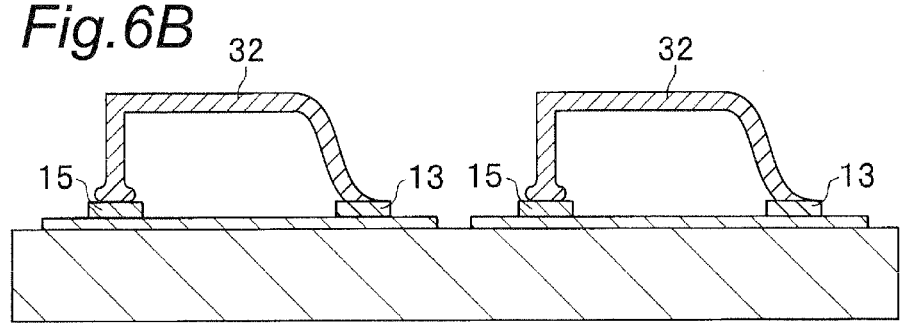

Next, in the providing wiring: S102, as shown in FIG. 6B, with respect to each of the light emitting elements on the growth substrate 11, a metal wire 32 is provided using a wire bonder to connect the n-side electrode 13b and the p-side electrode 15. The metal wire 32 is, as shown in FIG. 6B, connected to the p-side electrode 15 by way of ball bonding, a bump is formed at the tip of the metal wire 32, and is connected to the n-side electrode by way of wedge bonding, and an end of the metal wire 32 is connected to the n-side electrode 13 with its wedge-shaped tip portion. At this time, a portion of the metal wire 32 which is extending from the joining portion with the p-side electrode 15 in a vertical direction or an approximately vertical direction is arranged with a length so that the wiring can be higher than a predetermined height. Here, the term "predetermined height" is referred to a height of the upper surface of the first resin layer 311 shown in FIG. 1C, which is a height of a virtual cutting line 41 shown by the broken line in FIG. 6C.

Figure 6C:
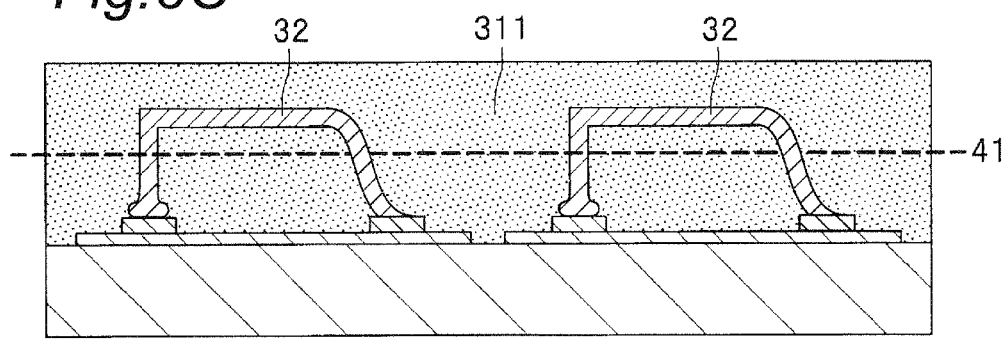

Next, in the forming first resin layer: S103, as shown in FIG. 6C, by way of compression molding using a mold for example, the first resin layer 311 is formed so as to completely enclose the light emitting elements 1 and the metal wires 32. At this time, the first resin layer 311 is formed so that the upper surface of the first resin layer 311 is at least higher than the virtual cutting line 41.

Figure 6D:
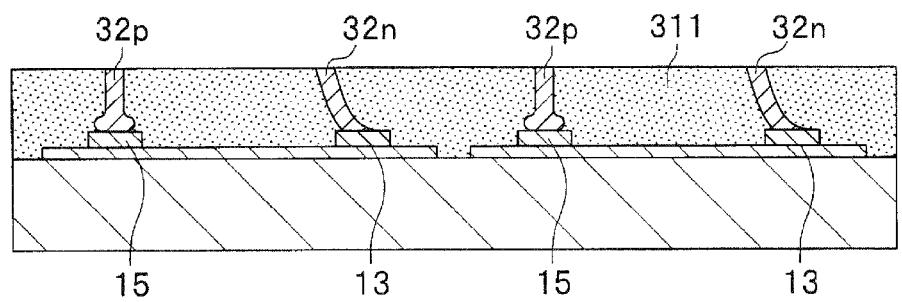

Next, in the cutting first resin layer: S104, using a cutting machine, together with the metal wires 32, the first resin layer 311 is cut from the upper surface side to the thickness indicated by the virtual cutting line 41. With this, each metal wire 32 is divided in two metal wires 32n, 32p, and as shown in FIG. 6D, the cross section of the metal wires 32 are exposed as the upper surfaces of the metal wires 32n, 32p which are on the same plane with the upper surface of the first resin layer 311.

Figure 7A:
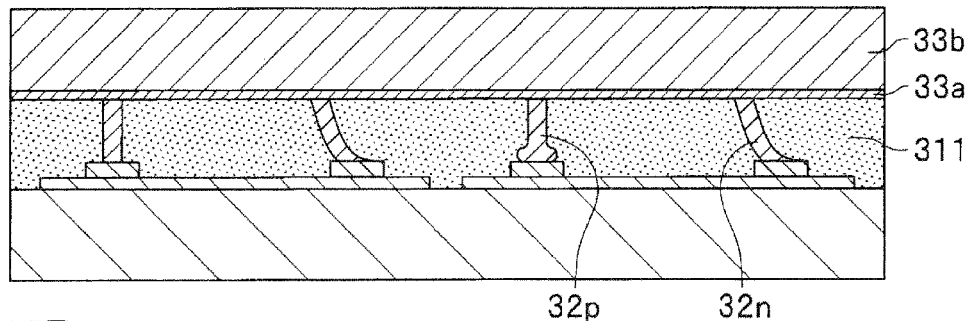
FIG. 7A to FIG. 7D are each a schematic cross sectional view showing a part of a manufacturing operations of a light emitting device according to a first embodiment of the present invention.

Next, in the forming plated layer: S105, metal plated layers 33n, 33p are formed. In this operation, five sub-operations are included. A first sub-operation includes forming seed layer in which a seed layer 33a is formed on the entire upper surface of the wafer, that is on the entire upper surface of the first resin layer 311 and the entire upper surface of the metal wires 32n, 32p by stacking thin layers of Ni and Au in this order by using a sputtering method. A second sub-operation includes forming plated layer in which by way of electrolytic plating method, using the seed layer 33a as a plating current path, a plated layer 33b is formed on the seed layer 33a. FIG. 7A illustrates formation of the plated layer 33b on the seed layer 33a. The plated layer 33b is formed so that the upper surface of the plated layer 33b has a height of at least a predetermined height. Here, the term "predetermined height" is referred to a height of the upper surface of the first resin layer 312 shown in FIG. 1C, which is a height of a virtual cutting line 42 shown by the broken line in FIG. 6C.

Figure 7B:
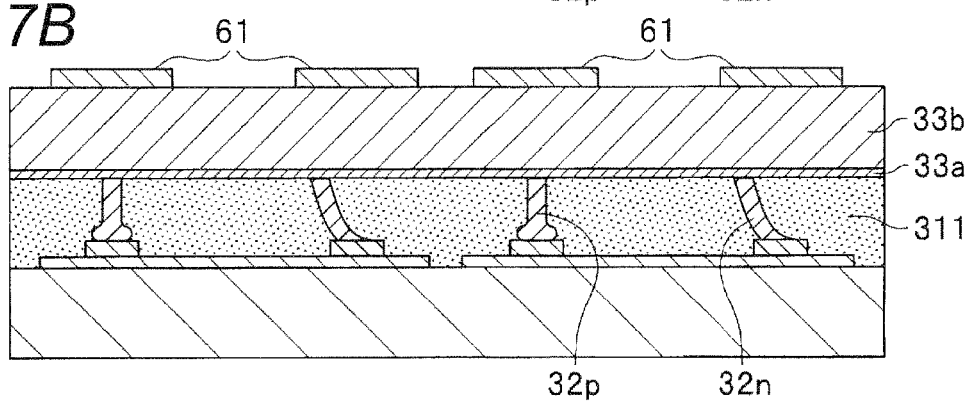
Figure 7C:
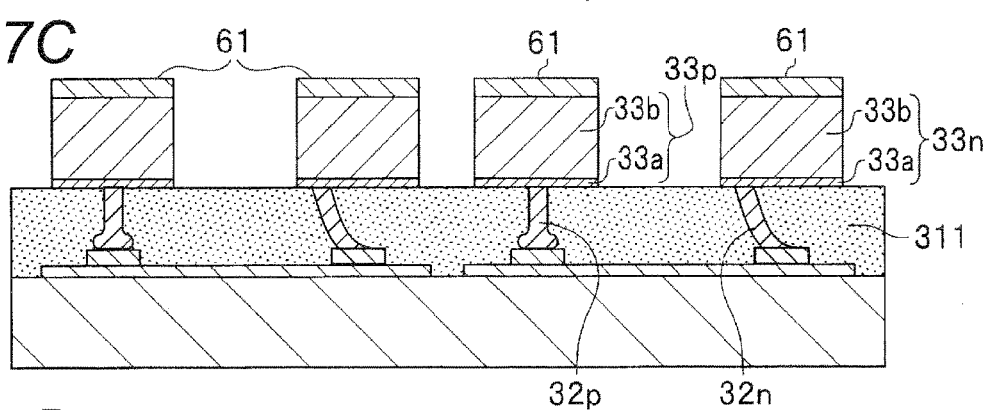
Figure 7D:
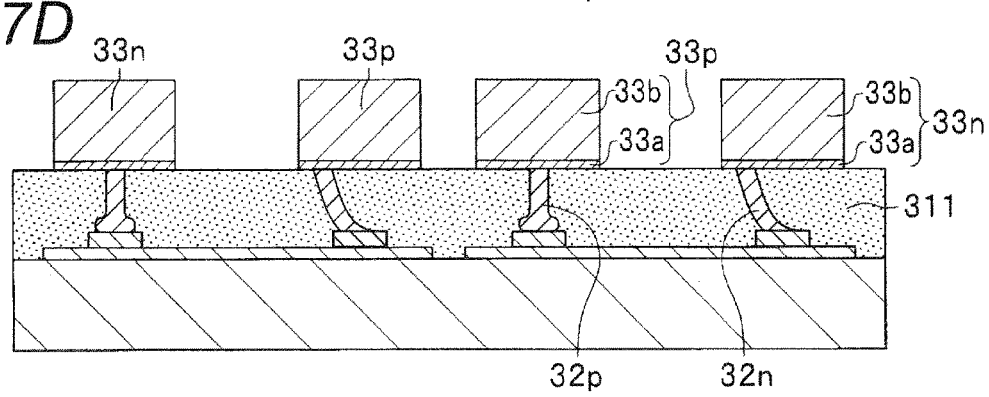

A third sub-operation includes forming resist pattern in which as shown in FIG. 7B, a resist pattern 61 is formed on the upper surface of the plated layer 33b to cover the regions designated for the metal plated layers 33n, 33p by using a photolithography method. A fourth sub-operation includes etching in which using the resist pattern 61 as a mask, for example, by way of wet etching, the plated layer 33b and the sheet layer 33a are removed. Thus, as shown in FIG. 7C, the metal plated layer patterns 33n, 33p are formed A fifth sub-operation includes removing resist pattern in which the resist pattern 61 is removed by using ashing and a chemical treatment to complete the metal plated layers 33n, 33p. Since the seed layer 33a is a sufficiently thin layer compared to the plated layer 33b, in the specification, for convenience of explanation, the seed layer 33a and the plated layer 33b are collectively referred to as "metal plated layers 33n, 33p".

In the etching in the fourth sub-operation, in the case where the plated layer 33b and the seed layer 33a are etched by wet etching, etching proceeds isotropically, not only in a thickness direction but also in a transverse direction. For this reason, the resist pattern 61 is preferably formed widely so that the patterned metal plated layers 33n, 33p obtained by the etching have predetermined intervals and sizes in a plan view, in consideration of the thicknesses of the plated layer 33b and the seed layer 33a and the etching rate ratio between the thickness direction and the transverse direction.

Figure 8A:
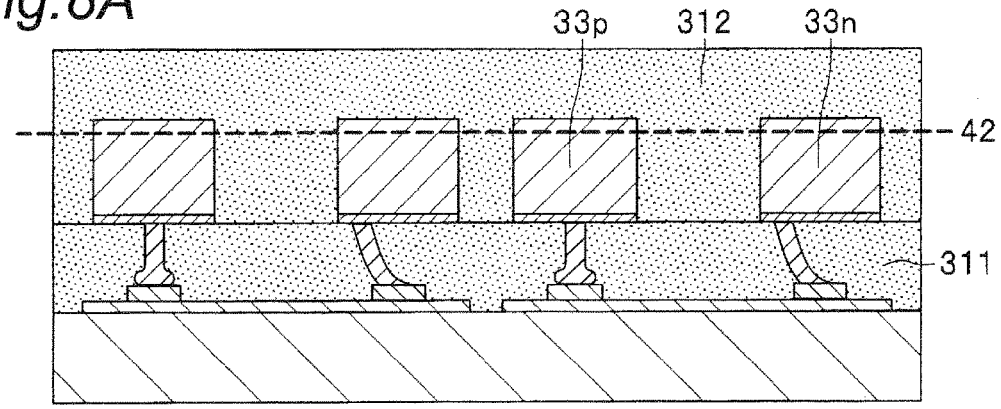
FIG. 8A to FIG. 8D are each a schematic cross sectional view showing a part of a manufacturing operations of a light emitting device according to a first embodiment of the present invention.

Next, in the forming second resin layer: S106, as shown in FIG. 8A, by way of compression molding using a mold for example, the second resin layer 312 is formed so as to enclose the metal plated layers 33n, 33p. At this time, the second resin layer 312 is formed so that the upper surface of the second resin layer 312 is at least higher than the virtual cutting line 42.

Figure 8B:
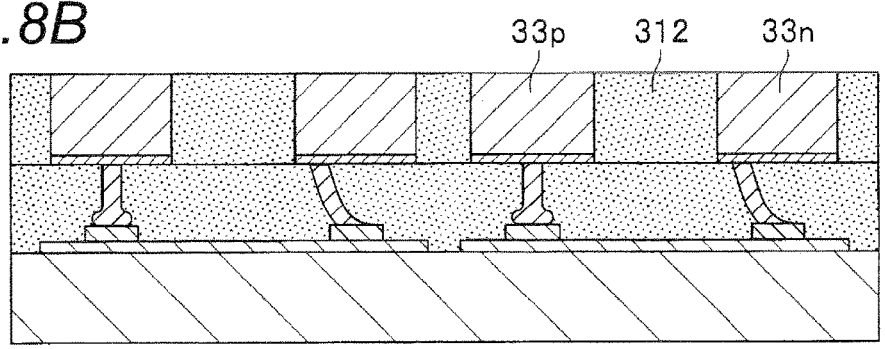

Next, in the cutting second resin layer: S107, using a cutting machine, together with the metal plated layers 33n, 33p which are contained therein, the second resin layer 312 is cut from the upper surface side to the thickness indicated by the virtual cutting line 42. With this, as shown in FIG. 8B, the upper surface of the metal plated layer 33n connected with the metal wire 32n and the upper surface of the metal plated layer 33p connected to the metal wire 32b are exposed so as to be in the same plane with the upper surface of the second resin layer 312.

Figure 8C:
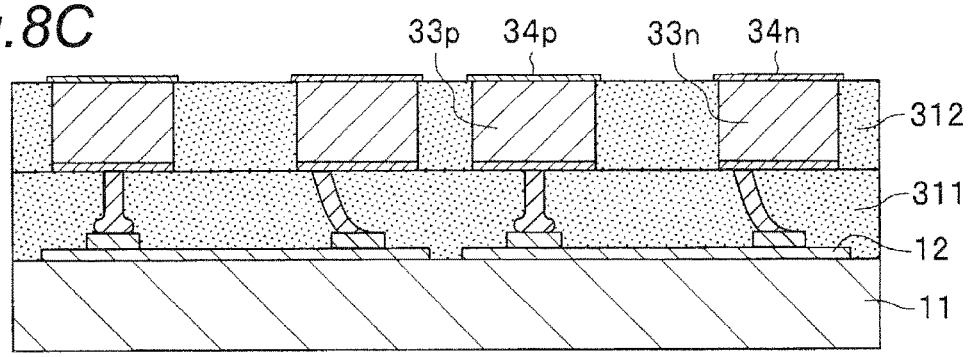

Next, in the disposing electrode for external connection: S108, as shown in FIG. 8C, the electrode for n-side external connection 34n and the electrode for p-side external connection 34p are disposed on the upper surface of the metal plated layers 33n, 33p and their adjacent portions of the upper surface of the second resin layer 312. Deposition of the metal layers to be served as the electrode for n-side external connection 34n and the electrode for p-side external connection 34p can be achieved by sputtering. For example, in the case where the metal plated layers 33n, 33p are made of Cu, in order to obtain good adhesion with an Au layer, it is preferable that a Ti layer and a Ni layer are formed in this order and then, the Au layer is stacked on the uppermost layer. For the patterning of the metal layer, a patterning method using etching or a patterning method using a lift-off operation can be employed.

A patterning method using etching can be carried out as below. First, with the use of a sputtering method, a metal layer is formed on the whole of the upper surface of the wafer, that is, on the whole of the upper surface of the metal plated layer 33n, 33p and the whole of the upper surface of the second resin layer 312. Next, with the use of a photolithography method, a resist pattern which covers the regions designated for the electrode for n-side external connection 34n and the electrode for p-side external connection 34p is formed. Then, using the resist pattern as a mask, unnecessary portions of the metal layer are removed by etching, and then, the resist pattern is removed.

A patterning method using lift-off operation can be carried out as below. First, with the use of a photolithography method, a resist pattern having openings corresponding to the regions designated for the electrode for n-side external connection 34n and the electrode for p-side external connection 34p is formed. Next, with the use of a sputtering method or the like, a metal layer is formed on the whole of the upper surface of the wafer. Then, the resist pattern is removed to remove the unnecessary portions of the metal layer on the resist pattern.

In the case where the electrode for n-side external connection 34n and the electrode for p-side external connection 34p are not extended onto the upper surface of the second resin layer 312 and formed only on the upper surfaces of the metal plated layers 33n, 33p, the electrode for n-side external connection 34n and the electrode for p-side external connection 34p can be formed by using an electrolytic plating method.

Figure 8D:
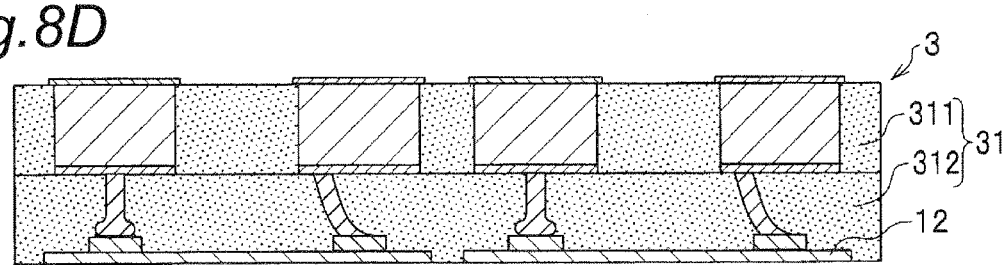
Figure 9A:
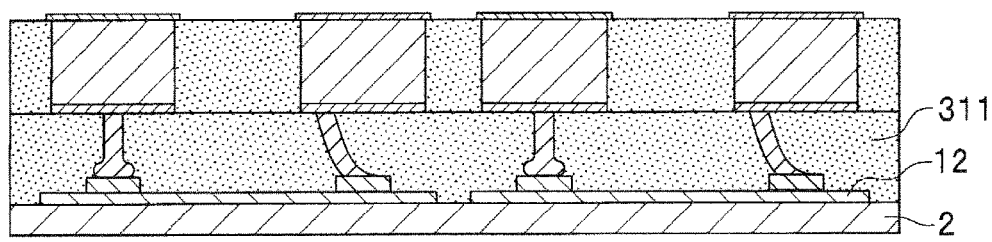
FIG. 9A and FIG. 9B are each a schematic cross sectional view showing a part of a manufacturing operations of a light emitting device according to a first embodiment of the present invention.
Figure 9B:
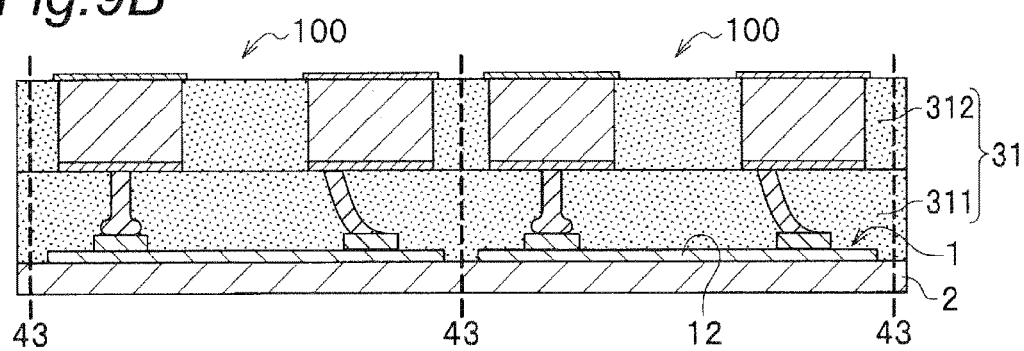

Next, in the removing growth substrate: S109, as shown in FIG. 8D, for example, using an LLO (laser lift off) method, a chemical lift off method, or the like, the growth substrate 11 can be peeled and removed. At this time, the semiconductor stacked layer structure body 12 is reinforced by the support member 3 which has the resin layer 31 as its base material, so that damage such as cracks and splits can be avoided.

After the growth substrate 11 is peeled off, the exposed lower surface of the semiconductor stacked layer body 12 may be polished, and then roughened, for example, by using a wet etching method, so that a recess-projection shape 12c (FIG. 2B, FIG. 3B) may be formed. By polishing the surface, the growth substrate 11 which is peeled off can be reused as a growth substrate 11 for growing a crystal of a semiconductor stacked layer body 12.

Next, in the forming fluorescent material layer (forming wavelength converting layer): S110, a fluorescent material layer 2 is formed on the lower surface side of the semiconductor stacked layer body 12. The fluorescent material layer 2 can be formed, for example as described above, by spray coating of a slurry which contains a resin and fluorescent material particles in a solvent. In the preparing light emitting element: S101, in the case where the semiconductor stacked layer body 12 in the border region of adjacent light emitting elements 1 is completely removes, the whole surfaces of the semiconductor stacked layer body 12 are resin sealed with the fluorescent material layer 2 which is made of a resin and the first resin layer 311.

Finally, in the singulating: S111, dicing is carried out along the virtual cutting lines 43 set in the border regions among the light emitting devices 100 to obtain the singulated light emitting devices 100. In the preparing light emitting element: S101, in the case where the semiconductor stacked layer body 12 in the border regions of adjacent light emitting elements 1 has been completely removed, the portions to be cut are made up solely of a resin layer, so that dicing can be carried out easily. According to the operations described above, the light emitting device 100 shown in FIG. 1A to FIG. 1D can be completed.

Also, as in the present embodiment, in the case where the support member 3 is constituted with a stacked layer structure of the first resin layer (wire embedding layer) 311 and the second resin layer (plated layer embedding layer) 312, the wiring lengths of the metal wires 32n, 32p which are contained as the inner conductive members and the wiring lengths of the metal plated layers 33n, 33p can be determined with the thickness of each resin layer (the first resin layer 311 and the second resin layer 312). Accordingly, variation in heat dissipation among the light emitting devices 100 can be reduced. As a result, variation in temperature rise among the light emitting elements 1 can be reduced and thus variation in light emitting output due to temperature rise can be reduced. This effect can be obtained in a similar manner with different orders of stacking or different numbers of stacking layers as in other embodiments to be described below.

Second Embodiment

Configuration of Light Emitting Device

Figure 10A:
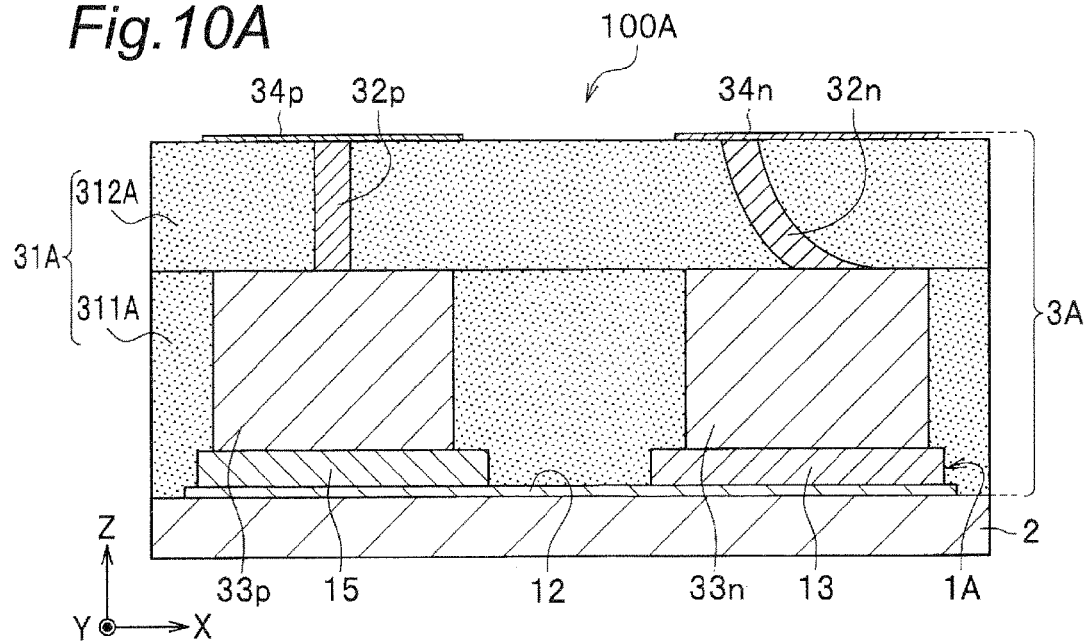
FIG. 10A and FIG. 10B are each a schematic plan view illustrating a configuration of a light emitting device according to a second embodiment and a third embodiment of the present invention respectively.

Next, with reference to FIG. 10A, a light emitting device according to a second embodiment and a third embodiment will be described. In the light emitting device 100A according to the second embodiment shown in FIG. 10A, the support member 3A includes, a resin layer 31A constituted with stacking layers in order from the light emitting element 1 side, a first resin layer (plated layer embedding layer) 311A which contains metal plated layers 33n, 33p as its inner conductive members, and a second resin layer (wire embedding layer) 312A which contains metal wires 32n, 32p as its inner conductive members. That is, the light emitting device 100A has a configuration in which the order of connection of the metal wires 32n, 32p and the metal plated layers 33n, 33p which are inner conductive members are reversed with respect to that of the light emitting device 100 shown in FIG. 1A to FIG. 1D. Also, in the present embodiment, as the light emitting element, the light emitting element 1A shown in FIG. 3A to FIG. 4B is used, and the n-side electrode 13 and the p-side electrode 15 are respectively provided in a wide region of the upper surface side of the light emitting element 1A.

As in the present embodiment, in the case where the metal plated layers 33n, 33p are used as the inner conductive member of the first layer, the metal plated layers 33n, 33p can be disposed in contact with a wide region of the n-side electrode 13 and the p-side electrode 15 respectively. Accordingly, heat dissipation performance through the n-side electrode 13 and the p-side electrode 15 can be improved and thus the temperature rise of the light emitting device 100 can be efficiently suppressed. Particularly, in the light emitting element 1A shown in FIG. 3A to FIG. 4B, in the case where the n-side electrode 13 and the p-side electrode 15 are disposed in a wide region of the upper surface side of the light emitting element 1A, and the metal plated layers 33n, 33p are disposed in contact with the n-side electrode 13 and the p-side electrode 15 respectively in a wide region, the n-side electrode 13 and the p-side electrode 15 can be made with a substantially increased thickness by the metal plated layers 33n, 33p. With this, the heat dissipating performance through the n-side electrode 13 and the p-side electrode 15 can be further improved and also diffusion of the current in the n-side electrode 13 and the p-side electrode 15 which are the pad electrodes can be improved.

Operation of Light Emitting Device

The light emitting device 100A according to the second embodiment has a structure which differs in the inner conductive member from the light emitting device 100 according to the first embodiment. Therefore, upon connecting an external power source between the electrode for n-side external connection 34n and the electrode for p-side external connection 34p, and through the inner conductive member, the electric current is supplied between the n-side electrode 13 and the p-side electrode 15 of the light emitting element 1, the operation of the light emitting device 100A will be similar to that of the light emitting device 100, so that detailed description on the operation will be appropriately omitted.

Method of Manufacturing Light Emitting Device

Figure 11:
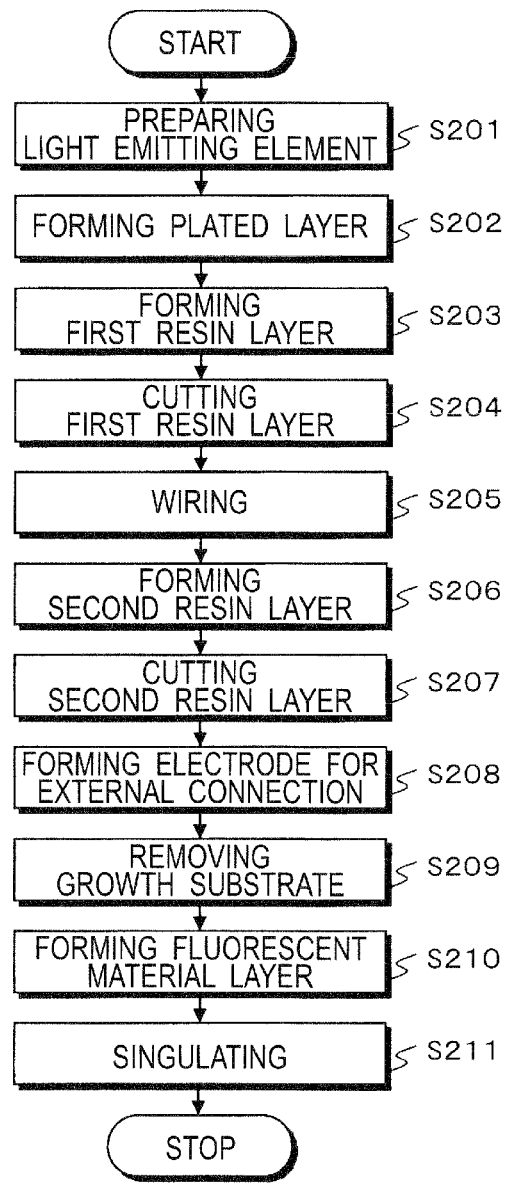
FIG. 11 is a flowchart showing the flow of operations of manufacturing a light emitting device according to a second embodiment of the present invention.

Next, with reference to FIG. 11 (also, appropriately referring to FIG. 5 and FIG. 10A), a method of manufacturing the light emitting device 100A according to the second embodiment will be described. As shown in FIG. 11, a method of manufacturing a light emitting device 100A includes, preparing light emitting element: S201, forming plated layer S202, forming first resin layer: S203, cutting first resin layer: S204, providing wiring: S205, forming second resin layer: S206, cutting second resin layer: S207, disposing electrode for external connection: S208, removing growth substrate: S209, forming fluorescent material layer (forming wavelength converting layer: S210, and singulating: S211, which are performed in this order.

First, in the preparing light emitting element: S201, in a similar manner as in the preparing light emitting element: S101 in the first embodiment, the light emitting elements 1A in a wafer state are prepared. The light emitting element 1A can be fabricated with a change in the region to form the step portion 12b and a change in the region in the upper surface of the protective layer 16 to where the n-side electrode 13 and the p-side electrode 15 are extended.

Next, in the forming plated layer: S205, metal plated layers 33n, 33p are formed with the procedure shown below. First, using a photolithography method, a first resist pattern having openings in conformity to the upper surfaces of the n-side electrodes 13 and the upper surfaces of the p-side electrodes 15 is formed on the upper surface of the wafer on which the light emitting elements are formed. Next, using a sputtering method, a seed layer is formed on the entire upper surface of the wafer. First, using a photolithography method, a second resist pattern having openings corresponding to the regions designated to form the metal plated layers 33n, 33p is formed. The second resist pattern is formed with a thickness greater than the thicknesses of the metal plated layers 33n, 33p. to be formed. Next, using the seed layer as a current path, a plated layer if formed using an electrolytic plating method. Then, removing the second resist pattern, that is, using a lift-off method, the plated layer is patterned. At the same time, the first resist pattern is also removed along with unnecessary portions of the seed layer. According to the procedure described above, the metal plated layers 33n, 33p can be formed.

Next, in a similar manner as in the forming second resin layer: S106 and the cutting second resin layer: S107, performing the forming first resin layer: S203 and the cutting first resin layer: S204 to form the first resin layer 311A so that the upper surfaces of the metal plated layers 33n, 33p are exposed.

Next, in the providing wiring: S205, in a similar manner as in the providing wiring: S102 in the first embodiment, using a wire bonder, a metal wire 32 (FIG. 6B) is arranged between the upper surface of the metal plated layer 33n and the upper surface of the metal plated layer 33p. The metal wire 32 is connected to the upper surface of the metal plated layer 33p by ball bonding. A bump is formed at the tip of the metal wire 32 and connected to the metal plated layer 33n by wedge bonding. One end of the metal wire 32 has a wedge-shaped tip portion which is connected to the metal plated layer 33n. Next, in a similar manner as in the forming first resin layer: S103 and the cutting first resin layer: S104 in the first embodiment, performing the forming second resin layer: S206 and the cutting second resin layer: S207 to form the second resin layer 312A so that the upper surfaces of the metal wires 32n, 32p are exposed.

Subsequent operations of the disposing electrodes for external connection: S208 to the singulating: S211 can be performed in a similar manner as in the corresponding operations in the first embodiment and the disposing electrodes for external connection: S108 to the singulating: S111, so that detailed description will be omitted. According to the operations described above, the light emitting device 100A shown in FIG. 10A can be completed.

Third Embodiment

Configuration of Light Emitting Devise

Figure 10B:
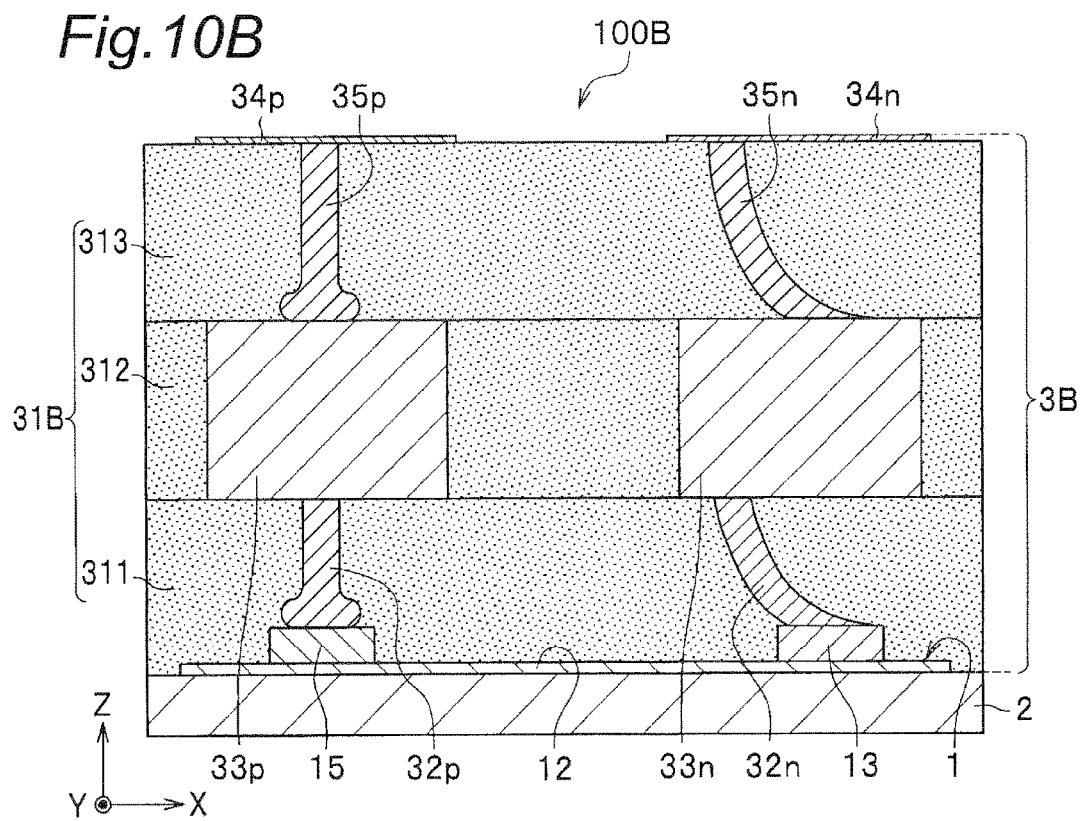

Next, with reference to FIG. 10B, a light emitting device according to a third embodiment will be described. In the light emitting device 100A according to the second embodiment shown in FIG. 10A, the support member 3A includes, a resin layer 31A constituted with stacking layers in order from the light emitting element 1 side, a first resin layer (plated layer embedding layer) 311A which contains metal plated layers 33n, 33p as its inner conductive members, and a second resin layer (wire embedding layer) 312A which contains metal wires 32n, 32p as its inner conductive members. That is, the light emitting device 100B has a resin layer 31B made of three layers, that is, in addition to the metal wires 32n, 32p and the metal plated layers 33n, 33p which provide the inner conductive members in the light emitting device 100, the resin layer 31B further includes a third layer which contains the second metal wires 35n, 35p respectively connected to the inner conductive members.

Also, as a variation example of the third embodiment, a resin layer may be made by stacking resin layers each containing metal plated layers, metal wires, or metal plated layers in this order from the light emitting element 1 side. The number of the stacked layers is not limited to two layers or three layers, but four layers or more can be employed. As described above, a thick resin layer can be formed by alternately stacking the resin layer which contains a metal wire and the resin layer which contains the metal plated layer. At this time, controlling the thickness of a single metal layer allows for stacking of a plurality of layers to obtain a thick resin layer while suppressing occurrence of warpage or peeling of the metal plated layer due to the stress. Also, in the entire resin layer, the rate of the metal plated layer which has good thermal conductivity in the thickness is not reduced, so that a thick support member having good heat dissipation performance can be formed.

Operation of Light Emitting Device

The light emitting device 100B according to the third embodiment has a structure which differs in the inner conductive member from the light emitting device 100 according to the first embodiment. Therefore, upon connecting an external power source between the electrode for n-side external connection 34n and the electrode for p-side external connection 34p, and through the inner conductive member, the electric current is supplied between the n-side electrode 13 and the p-side electrode 15 of the light emitting element 1, the operation of the light emitting device 100B will be similar to that of the light emitting device 100, so that detailed description on the operation will be appropriately omitted.

Method of Manufacturing Light Emitting Device

Figure 12:
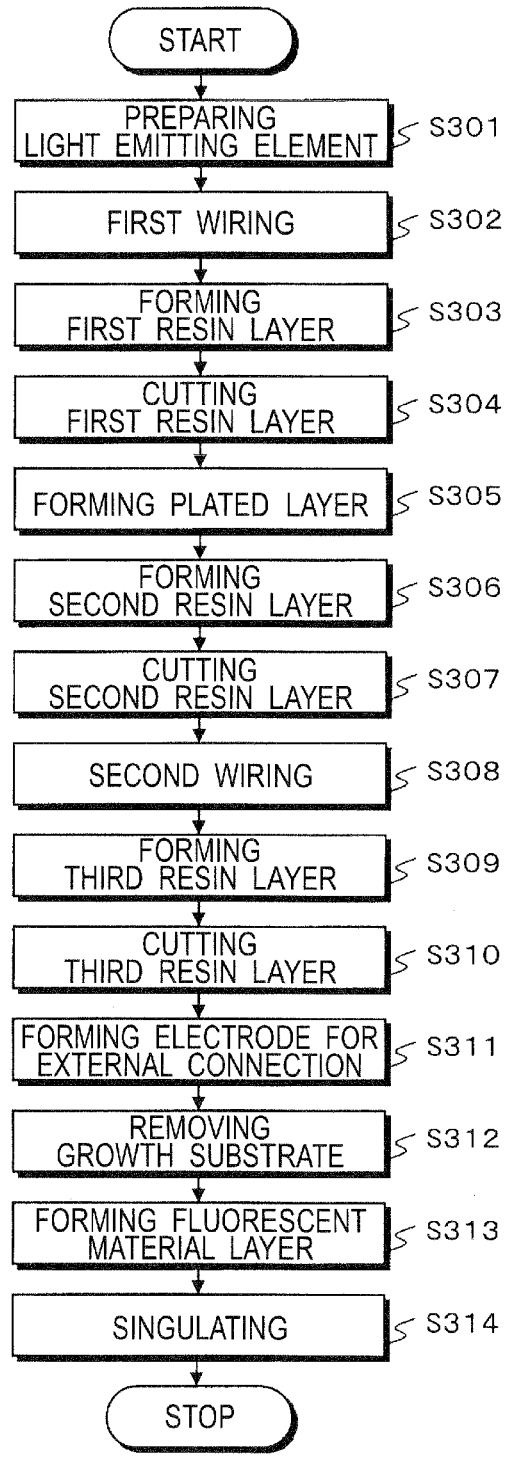
FIG. 12 is a flowchart showing the flow of operations of manufacturing a light emitting device according to a third embodiment of the present invention.

Next, with reference to FIG. 12 (also, appropriately referring to FIG. 5 and FIG. 10B), a method of manufacturing the light emitting device 100B according to the third embodiment will be described. As shown in FIG. 12, a method of manufacturing a light emitting device 100B includes, preparing light emitting element: S301, providing wiring: S302, forming first resin layer: S303, cutting first resin layer: S304, disposing plating layer: S305, forming second resin layer: S306, cutting second resin layer: S307, providing second wiring: S308, forming third resin layer: S309, cutting third resin layer: S310, disposing electrode for external connection: S311, removing growth substrate: S312, forming fluorescent material layer (forming wavelength converting layer: S313, and singulating: S314, which are performed in this order.

The preparing light emitting element: S301 to the cutting second resin layer: S307 are performed in a similar manner as in the preparing light emitting element: S101 to the cutting second resin layer: S107 of the first embodiment respectively. Accordingly, a state which is shown in FIG. 8B, in which on each light emitting element 1, the first resin layer 311 which contains the first metal wires 32n, 32p and the second resin layer 312 which contains the metal plated layer 33n, 33p are stacked, and the upper surface of the metal plated layer 33n, 33p are respectively exposed.

Next, in the disposing second wiring: S308, in a similar manner as in the disposing wiring: S102 in the first embodiment, a wire bonder is used to provide a metal wiring between the upper surface of the metal plated layer 33n and the upper surface of the metal plated layer 33p. Next, in a similar manner as in the forming first resin layer: S103 and the cutting first resin layer: S104, performing the forming third resin layer: S309 and the cutting third resin layer: S310 to form the third resin layer 313 so that the upper surface of the second metal wire 35n, 35p are exposed.

Subsequent operations of the disposing electrodes for external connection: S311 to the singulating: S314 can be perform in a similar manner as in the corresponding operations in the first embodiment and the disposing electrodes for external connection: S108 to the singulating: S111, so that detailed description will be omitted. According to the operations described above, the light emitting device 100B shown in FIG. 10B can be completed.

Variant Example

Next, with reference to FIG. 13, a variant example of providing wiring (providing wiring: S102, providing wiring: S205, providing first wiring: S302 and providing second wiring: S308) will be described.

In the embodiments described above, at the time of providing metal wires 32n, 32p, 35n, and 35p, (hereinafter may be referred to as "metal wire 32") using a wire bonder, the metal wire 32 is arranged between the n-side electrode 13 and the p-side electrode 15, or between the metal plated layer 33n and the metal plated layer 33p. As shown in FIG. 13B, an end portion of the metal wire 32 is fusion bonded to the n-side electrode 13 etc. by ball bonding in which, using the wire bonder 50, an end portion of the metal wire 32 is pressed on the upper surface of the n-side electrode 13 or the like while applying ultrasonic vibrations. At this time, a ball-shaped bump 32a which is larger than the diameter of the metal wire 32 is created at the fusion-bonded portion.

In the present variant example, in place of the metal wire 32, a stacked bump 32A which is a stack of bumps 32a as shown in FIG. 13A is used for the inner conductive member. As described above, the stacked bump 32A is formed thicker than the original wire 32. Accordingly, with the use of the stacked bump 32A, the thermal resistance of the inner conductive member is reduced compared to the case that employs the metal wire 32, thus, heat dissipation performance of the light emitting device 100 etc., can be improved. In the present variant example, the stacked bump 32A is used for the inner conductive member, but it is not limited thereto, in place of the stacked bump 32A, the inner conductive member may be constituted with a single bump 32a. Also, in the present specification, inner conductive elements constituted with a stacked bump 32A inclusive of a plurality of bumps 32a and inner conductive elements constituted with a single bump may be collectively referred to as "metal wire bump". The expression "stacking number of one" in the present specification does not include a configuration in which a bump is formed at a tip of the metal wire as in the first embodiment, but refers to a configuration which includes only a bump which is substantially thicker than the metal wire.

The stacked bump 32A can be made by, using a wire bonder 50, repetitively performing forming a bump 32a and cutting metal wire 32 at upper end of the bump 32a. The stacked bump 32A is formed to have a larger diameter compared to the diameter of the metal wire 32, and to have sufficient rigidity so as not to fall off at the time of forming first resin layer 311 and the like. Thus, wiring in a substantially square shape or a reverse U-shape between two electrodes is not needed. Accordingly, in the present variant example, in the providing wiring, stacked bumps 32A are formed on the upper surface of each n-side electrode 13 etc., with at least a predetermined height (i.e. equal or greater than the thickness of the first resin layer 311 etc., which incorporates the stacked bump 32A at the time of completion of the light emitting device 100 etc.). The subsequent operations of forming the first resin layer 311 etc. and cutting the first resin layer 311 can be performed in a similar manner as in the case where a metal wire 32 is used as the inner conductive member.

Fourth Embodiment

Configuration of Light Emitting Device

With referring to FIG. 14A to FIG. 15B, and FIG. 17A to FIG. 19, a light emitting device according to a fourth embodiment will be described. In the light emitting device 100C according to the fourth embodiment shown in FIG. 14A to FIG. 15B, the support member 3C includes a resin layer 31C constituted with stacked layer, in order from the light emitting element 1C side, a first resin layer (plated layer embedding layer) 311C which contains metal plated layers 33n, 33p as its inner conductive members, a second resin layer (wire embedded layer) 312C in which inner conductive members of stacked bumps 32An, 32Ap and transverse wiring layers 36n, 36p are embedded, and a third resin layer (plated layer embedding layer) 313C in which second metal plated layers 37n, 37p are embedded as an inner conductive members. Also, on the upper surface of the third resin layer 313C which is the uppermost layer, upper surfaces of the second metal plated layers 37n, 37p are exposed so as to be in a same plane as the upper surface of the third resin layer 313C. In the present embodiment, the exposed upper surfaces of the second metal plated layers 37n, 37p also serve as the electrodes for external connection.

Figure 14A:
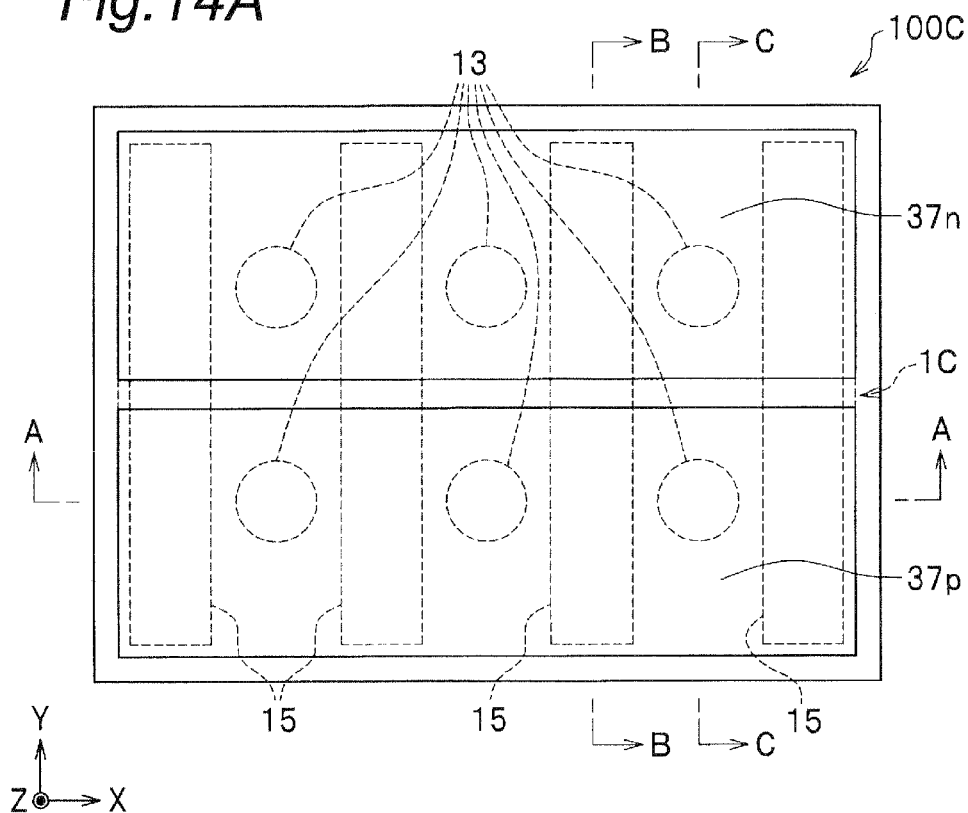
FIG. 14A is a schematic plan view of a configuration of a light emitting device according to a fourth embodiment of the present invention.
Figure 14B:
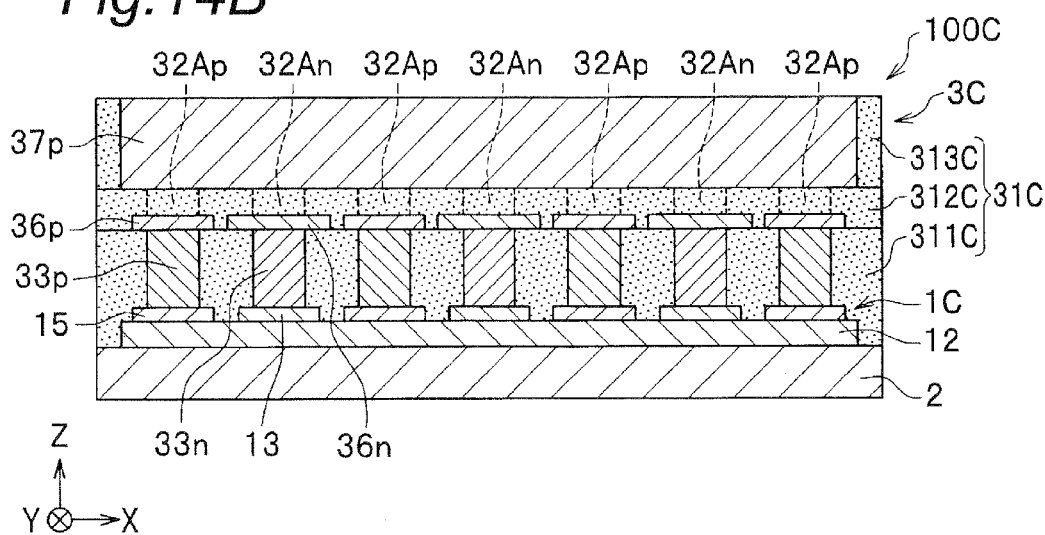
FIG. 14B is a schematic cross sectional view taken along line A-A of FIG. 14A.
Figure 15A:
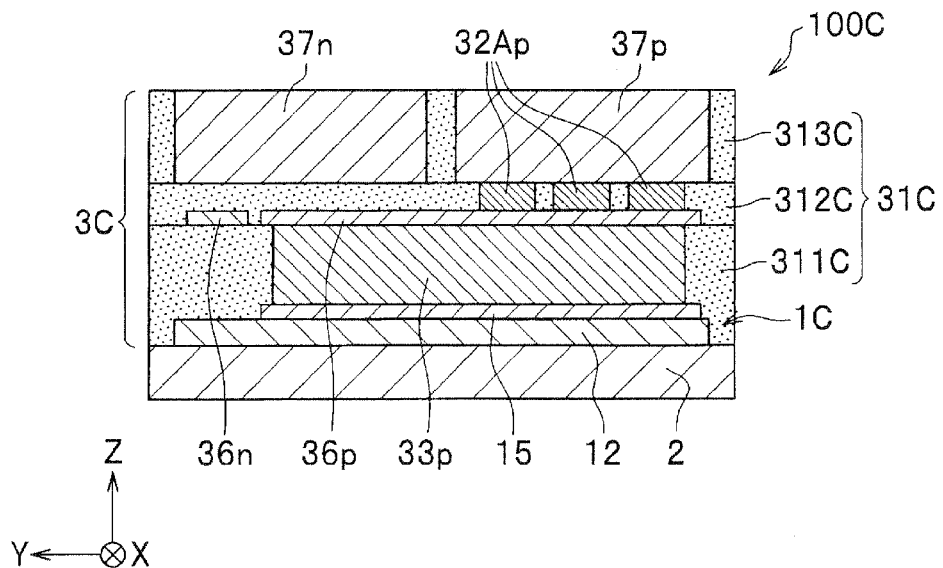
FIG. 15A is a schematic cross sectional view taken along line B-B of FIG. 14A.
Figure 15B:
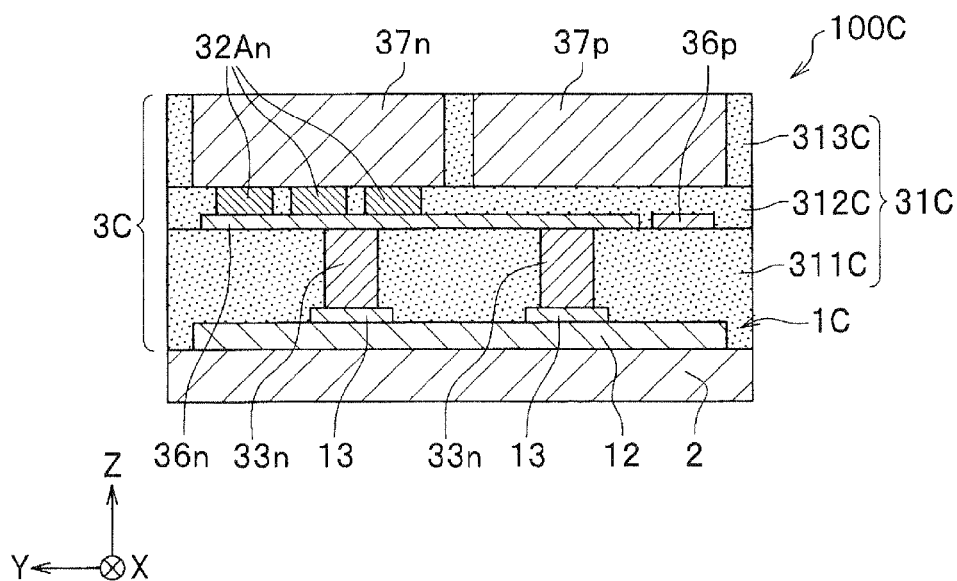
FIG. 15B is a schematic cross sectional view taken along line C-C of FIG. 14A.

As shown in FIG. 14A, in the present embodiment, the light emitting element 1C is arranged with four p-side electrodes 15 each having a lengthwise long rectangular shape in a plan view, and between each adjacent two p-side electrodes 15 of the four, two n-side electrodes 13 having a circular shape in a plan view are arranged in a longitudinal directions, thus, in total of six n-side electrodes 13 are arranged. In the light emitting element 1C, in addition to the configuration of the light emitting element 1 as shown in FIG. 2A and FIG. 2B, the step portion 12b is formed in a plurality of locations. The n-side electrode 13 is provided at each step portion 12b and also the p-side electrodes 15 are provided at a plurality of locations. Thus, the dissipation of the current supplied from outside can be improved. The light emitting element 1C is configured in a similar manner as in the light emitting element 1 except that the number of the electrodes is increased. Thus, detailed description of the light emitting element 1C will be appropriately omitted.

The first resin layer 311C is disposed at the upper surface side of the light emitting element 1C, to support the inner conductive member of six first metal plated layers 33n (FIG. 17B) electrically connected to the n-side electrodes 13 respectively and four first metal plated layers 33p (FIG. 17B) electrically connected to the p-side electrodes 15 respectively, while sealing the upper surface and the side surfaces of the light emitting element 1C. Also, the first resin layer 311C is in contact with the fluorescent material layer 2 at an outer side of the outer peripheral portion of the light emitting element 1C. Thus, the entire surfaces of the light emitting element 1C are resin-sealed with the first resin layer 311 and the fluorescent material layer 2.

Figure 17A:
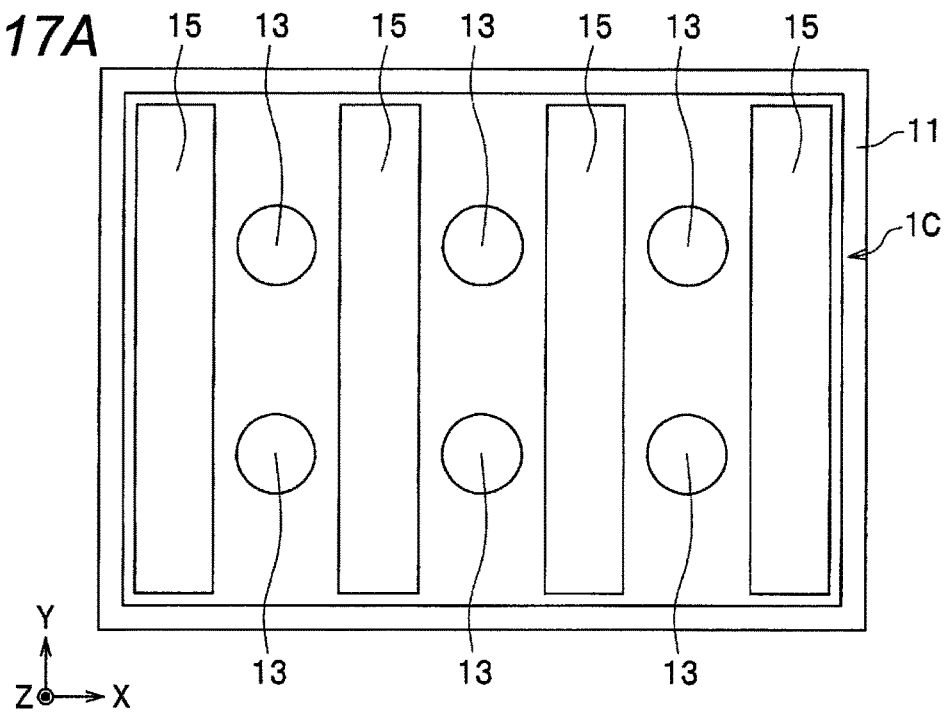
FIG. 17A is a schematic plan view illustrating formation of a semiconductor light emitting element in a manufacturing operations according to a fourth embodiment of the present invention.
Figure 17B:
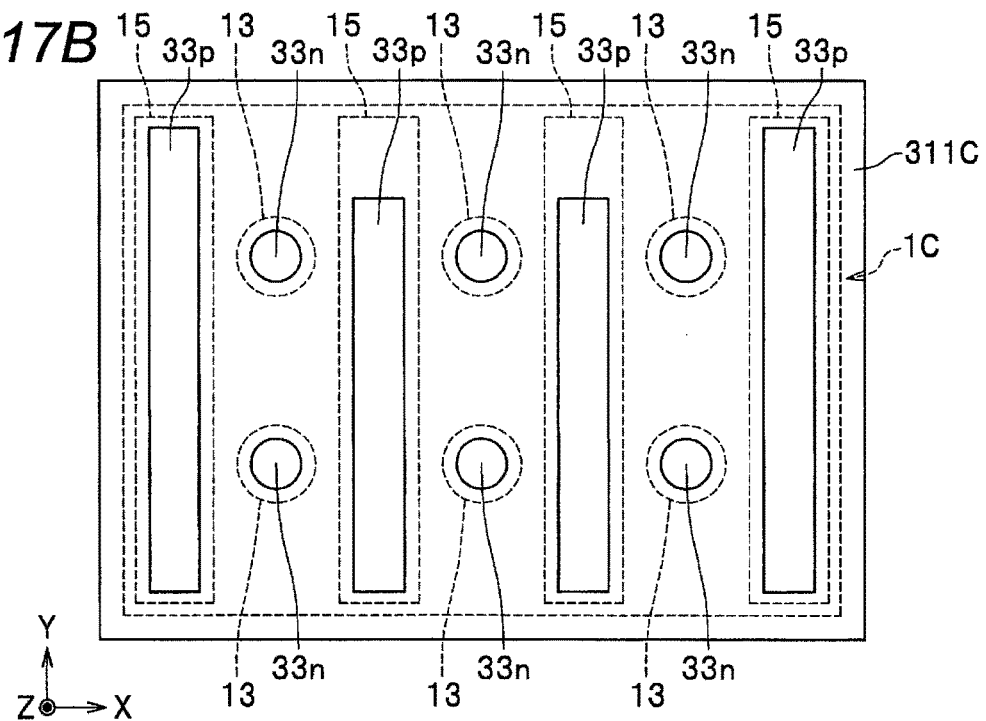
FIG. 17B is a schematic plan view illustrating formation of a first resin layer in a manufacturing operations according to a fourth embodiment of the present invention.
Figure 18A:
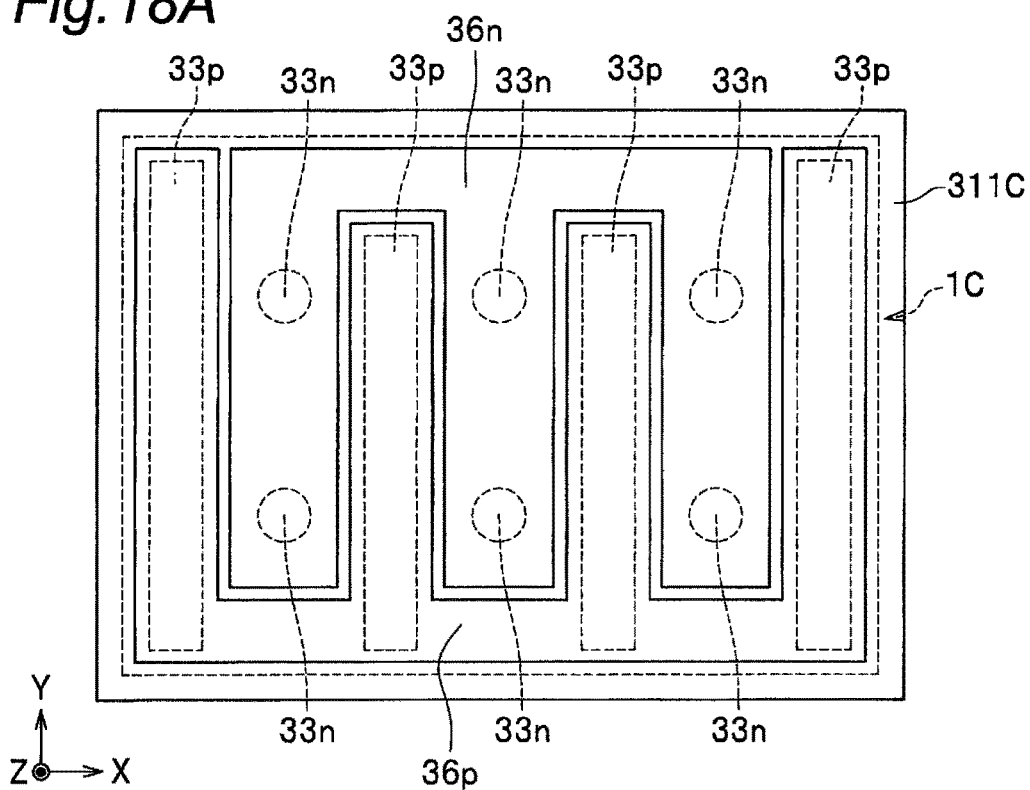
FIG. 18A is a schematic plan view illustrating formation of a transverse wiring layer in a manufacturing operations according to a fourth embodiment of the present invention.

As for the first metal plated layer 33n, as shown in FIG. 17B, one first metal plated layer 33n is disposed on each upper surface of the six n-side electrodes 13, and as shown in FIG. 18A, the upper surfaces of the first metal plated layers 33n are connected to one transverse wiring layer 36n.

The first metal plated layer 33n is a columnar metal layer with a circular shape in a plan view. As for the first metal plated layer 33p, as shown in FIG. 17B, one first metal plated layer 33n is disposed on each upper surface of the four p-side electrodes 15, and as shown in FIG. 18A, the upper surfaces of the first metal plated layers 33p are connected to one transverse wiring layer 36p. The first metal plated layer 33p is a quadrangular prism-shaped metal layer with a lengthwise long rectangular shape in a plan view.

The second resin layer 312C is formed in contact with the upper surface of the first resin layer 311C and incorporates the inner conductive members each made of a transverse wiring 36, 36p and a stacked bump 32An, 32Ap respectively. The transverse wiring layer 36n and the transverse wiring layer 36p are as shown in FIG. 18A, in a plan view, formed in a comb-shape each having three teeth and four teeth, which are respectively extended in a vertical direction (a Y-axis direction) and engage with each other. The transverse wiring 36n and the transverse wiring 36p are spaced apart from each other so as not to cause a short circuit. The transverse wirings 36n, 36p can be formed by using a metal material which is similar to that in the lower layer of the first plating layers 33n, 33p, or by using a metal material which has good bonding property, and using sputtering method or the like.

Figure 18B:
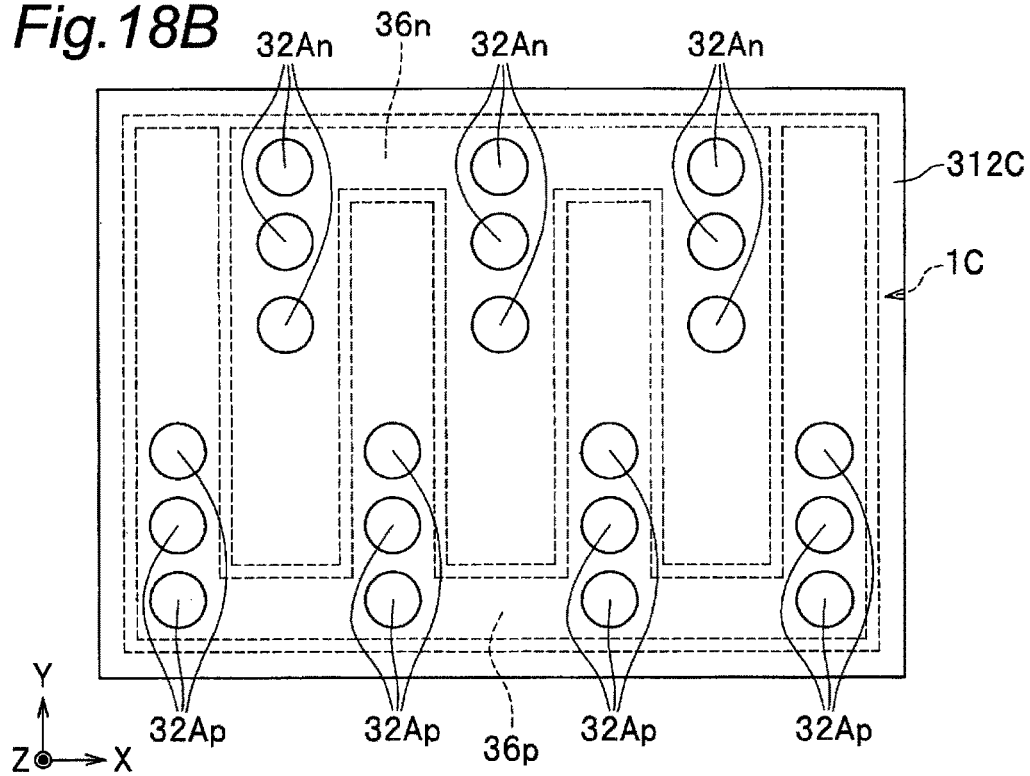
FIG. 18B is a schematic plan view illustrating formation of a second resin layer in a manufacturing operations according to a fourth embodiment of the present invention.

The transverse wiring layer 36n is, as shown in FIG. 18A, connected to six first metal plated layers 33n at its lower surface side and as shown in FIG. 18B, connected to nine stacked bumps 32An at its upper surface side. The transverse wiring layer 36n is, as shown in FIG. 18A, connected to four first metal plated layers 33p at its lower surface side and as shown in FIG. 18B, connected to twelve stacked bumps 32Ap at its upper surface side.

A comparison between FIG. 18A and FIG. 18B indicates that, in a plan view, some of the first metal plated layers 33n which are the n-side inner conductive member at a lower layer side are not overlapped with any one of the stacked bumps 32An which are the n-side inner conductive member at an upper surface side. For this reason, through the transverse wiring layer 36n which is provided extending in a lateral direction (X-Y plane), the first metal plated layer 33n and the stacked bump 32Ar are configures to be electrically connected.

A comparison between FIG. 18A and FIG. 18B indicates that, in a plan view, some of the first metal plated layers 33p which are the p-side inner conductive member at a lower layer side are overlapped with some of the stacked bumps 32Ap which are the p-side inner conductive member at an upper surface side. For this reason, through the transverse wiring layer 36n which is provided extending in a lateral direction (X-Y plane), the first metal plated layer 33n and the stacked bump 32Ar are configures to be electrically connected. This allows a configuration in which the first metal plated layers 33p and the stacked bumps 32Ap are not overlapped in a plan view.

Figure 19:
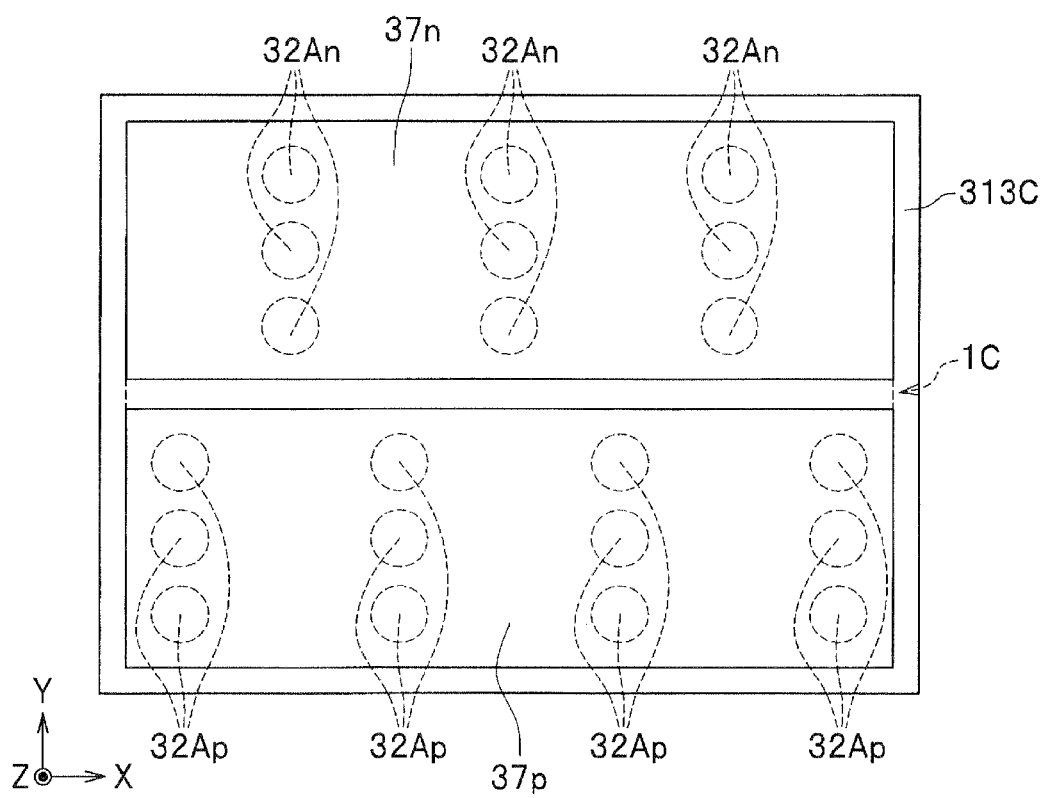
FIG. 19 is a schematic plan view illustrating formation of a third resin layer in a manufacturing operation according to a fourth embodiment of the present invention.

In a plan view, nine stacked bumps 32An are arranged as shown in FIG. 18B, on the transverse wirings 36n, and as shown in FIG. 19, in a region overlapping with the second metal plated layer 37n which is an electrode for n-side external wiring at the upper surface side. Also, in a plan view, twelve stacked bumps 32Ap are arranged as shown in FIG. 18B, on the transverse wirings 36p, and as shown in FIG. 19, in a region overlapping with the second metal plated layer 37p which is an electrode for p-side external wiring at the upper surface side.

The third resin layer 313C is disposed in contact with the upper surface of the second resin layer 312C and incorporates the inner conductive members each made of the second metal plated layer 37n, 37p. Upper surfaces of the second metal plated layer 37n and the second metal plated layer 37p are exposed from the third resin layer 313C, and respectively also serves as the electrode for n-side external connection and the electrode for p-side external connection. Also, the second metal plated layer 37n has nine stacked bumps 32An connected to its lower surface side, and the second metal plated layer 37p has twelve stacked bumps 32An connected to its lower surface side.

It is preferable that in the second metal plated layers 37n, 37p, at least the uppermost layer is made of Au or an alloy whose major component is Au. Alternatively, without using the second metal plated layers 37n, 37p also as the electrodes for external connection, electrodes for external connection can be provided separately on the upper surface of the second metal plated layers 37n, 37p.

As described above, a plurality of (i.e. six) n-side electrodes 13 are connected to the single second metal plated layer 37n which also serves as the electrode for external connection, by the first metal plated layer 33n, the transverse wiring layer 36n, and the stacked bump 32An which form an n-side inner conductive member. Also, a plurality of (i.e. four) p-side electrodes 15 are connected to the single second metal plated layer 37p which also serves as the electrode for external connection, by the first metal plated layer 33p, the transverse wiring layer 36p, and the stacked bump 32Ap which form an p-side inner conductive member.

As described above, in a plan view, the second metal plated layer 37n which is the electrode for n-side external connection is disposed in a region which is an upper half (+y-axis direction side), and the second metal plated layer 37p which is the electrode for p-side external connection is disposed in a region which is a lower half (—Y-axis direction side). For this reason, it is not possible to stacking inner conductive member in a direction directly upward of the n-side electrode 13 and the p-side electrode 15 and respectively connected to the second metal plated layer 37n and the second metal plated layer 37p.

In the present embodiment, the inner conductive member is made of three layer structure and interposing the transverse wirings 36n, 36p. Accordingly, a plurality of electrodes of at either the n-side or p-side of the light emitting element 1C can be connected to the second plated layers 37n, 37p which are a pair of electrodes for external connection demarcated in two simple rectangular regions. That is, with the internal electrode having a multilayer structure, even in the case where the pad electrodes of the light emitting elements are disposed with a complicated arrangement, connection with the electrodes for external connection which have simple structures can be achieved. The configuration of the inner conductive member s is not specifically limited to those illustrated in FIG. 3A to FIG. 4B, and for example, in place of the stacked bumps 32An, 32Ap, metal wires 32 (for example, FIG. 13B) may be employed.

Operation of Light Emitting Device

The light emitting device 100C according to the fourth embodiment has a structure which differs in the inner conductive member from the light emitting device 100 according to the first embodiment. Therefore, upon connecting an external power source between the electrode for n-side external connection 37n and the electrode for p-side external connection 37p, and through the inner conductive member, the electric current is supplied between the n-side electrode 13 and the p-side electrode 15 of the light emitting element 1C, the operation of the light emitting device 100C will be similar to that of the light emitting device 100, so that detailed description on the operation will be appropriately omitted.

Method of Manufacturing Light Emitting Device

Figure 16:
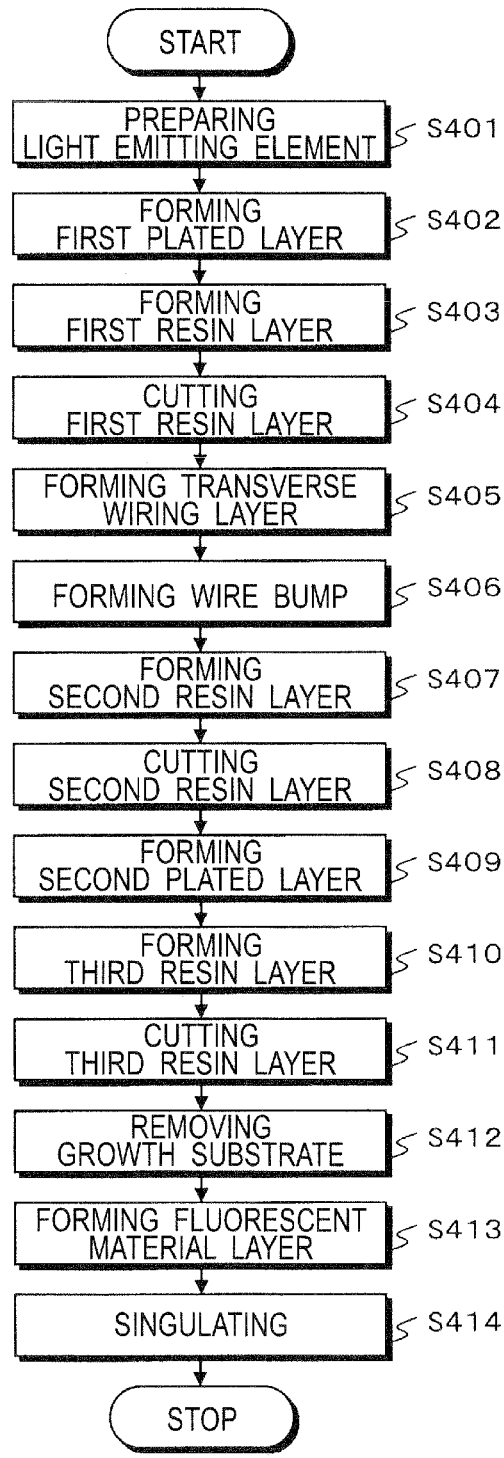
FIG. 16 a flowchart showing the flow of operations of manufacturing a light emitting device according to a fourth embodiment of the present invention.

Next, with reference to FIG. 16 (also, appropriately referring to FIG. 14A to FIG. 15B), a method of manufacturing the light emitting device 100C according to the fourth embodiment will be described. As shown in FIG. 16, a method of manufacturing a light emitting device 100 includes, preparing light emitting element: S401, forming first plated layer: S402, forming first resin layer: S403, cutting first resin layer: S404, forming transverse wiring: S405, forming wire bump: S406, forming second resin layer: S407, cutting second resin layer: S108, forming second plated layer: S409, Forming third resin layer: S410, cutting third resin layer: S411, removing growth substrate: S412, forming fluorescent material layer (forming wavelength converting layer): S413, and singulating: S414, which are performed in this order.

In the below, with reference to FIG. 17A to FIG. 19, (also FIG. 2A to FIG. 16 when appropriate), each operation of a method of manufacturing the light emitting device 100C will be described. In FIG. 17A to FIG. 19, manufacturing of single light emitting device 100C is illustrated, but until singuraled in singulation: S414, the light emitting devices 100C are produced in a wafer state where a plurality of light emitting elements 1C are arranged.

First, in preparing light emitting element: S401, in a similar manner as in preparing light emitting element: S101 in the first embodiment, as shown in FIG. 17A a wafer having arrays of light emitting elements 1C disposed on a growth substrate 11 is prepared. On the upper surface of each light emitting element, six n-side electrodes 13 and four p-side electrodes 15 are formed.

Next, in a similar manner as in the forming plated layer: S202, the forming first resin layer: S203 and the cutting first resin layer: S204, respectively of the second embodiment, forming first plated layer: S402, forming first resin layer: S403 and cutting first resin layer: S404, are performed, to form the first resin layer 311C which incorporates the first metal plated layers 33n, 33p and expose the upper surfaces of those. On each of the n-side electrodes 13, single first metal plated layer 33n is formed, and on each of the p-side electrodes 15, single first metal plated layer 33p is formed.

Next, in the forming transverse wiring layer: S406, using a sputtering method or the like, as shown in FIG. 18A, transverse wiring layers 36n, 36b are formed on the upper surface of the first resin layer 311C. For the patterning of the transverse wiring layers 36n, 36p, a patterning method using etching or a patterning method using a lift-off operation can be employed. Next, in the forming wire bump: S406, using a wire bonder, as shown in FIG. 18B, stacked bumps 32An, 32Ap are formed on the respective predetermined positions of the transverse wiring layers 36n, 36p. At this time, the upper surfaces of the stacked bumps 32An, 32Ap are formed with a same height as or higher than the height of the upper surface of the completed second resin layer 31C.

Next, in a similar manner as in the forming second resin layer: S106 and the cutting second resin layer: S107, of the first embodiment, forming second resin layer: S407 and cutting third resin layer: S408 are performed. Thus, as shown in FIG. 18B, a second resin layer 312C which incorporates transverse wiring layers 36n, 36p and stacked bumps 32An, 32Ap, and exposes the upper surfaces of the stacked bumps 32An, 32Ap is formed.

Next, in a similar manner as in the forming second plated layer: S105, the forming second resin layer: S106 and the cutting second resin layer: S107 respectively of the first embodiment, forming second plated layer: S409, forming third resin layer: S410, and cutting third resin layer: S411 are performed. Thus, on the second resin layer 312C, as shown in FIG. 19, a third resin layer 313C which incorporates a second metal plated layers 37n, 37p and exposes the upper surfaces of the second metal plated layers 37n, 37p is formed.

Next, in a similar manner as in the removing growth substrate: S109, the forming fluorescent material layer: S110 and the singulating S: 414, removing growth substrate: S412, forming fluorescent material layer: S413 and singulating: S414 are respectively performed. Thus, a light emitting device 100C as shown in FIG. 14A to FIG. 15B is completed.

As shown in the above, a semiconductor light emitting element and a method of manufacturing the semiconductor light emitting element are illustrated in accordance with the embodiments for carrying out the present invention, but the scope of the invention is not limited to the above description, and should be widely understood based on the scope of claim for patent. Further, based on the above description, it will be obvious that various changes and modifications can be made therein without departing from the scope of the invention.

What is claimed is:

1. A method of manufacturing a light emitting device, the method comprising:

providing one or more light emitting elements on a growth substrate, each light emitting element comprising a first conductive type semiconductor layer, a second conductive type semiconductor layer, a first electrode connected to the first conductive type semiconductor layer and a second electrode connected to the second conductive type semiconductor layer;

connecting a first wire to each respective first electrode and connecting a second wire to each respective second electrode;

forming a first resin layer that covers each of the one or more light emitting elements such that an end portion of each first wire and an end portion of each second wire is exposed;

forming a first metal layer connected with each respective end portion of each first wire and forming a second metal layer connected with each respective end portion of each second wire; and forming a second resin layer on the first resin layer such that the first and second metal layers are embedded in the second resin layer and upper surfaces of the first and second metal layers are exposed from the second resin layer.

2. A method of manufacturing a light emitting device, the method comprising:

providing one or more light emitting elements on a growth substrate, each light emitting element comprising a first conductive type semiconductor layer, a second conductive type semiconductor layer, a first electrode connected to the first conductive type semiconductor layer and a second electrode connected to the second conductive type semiconductor layer;

providing a wire that connects each first electrode to each second electrode in each respective light emitting element;

forming a first resin in which each light emitting element and each wire is embedded;

cutting the first resin and each wire so as to form a first wire connected to each respective first electrode and a second wire connected to each respective second electrode, and so as to form a first resin layer that covers each light emitting element such that an end portion of each first wire and an end portion of each second wire is exposed;

forming a first metal layer connected with each respective end portion of each first wire and forming a second metal layer connected with each respective end portion of each second wire; and forming a second resin layer on the first resin layer such that upper surfaces of the first and second metal layers are exposed from the second resin layer.

3. A method of manufacturing a light emitting device, the method comprising:

providing one or more light emitting elements on a growth substrate, each light emitting element comprising a first conductive type semiconductor layer, a second conductive type semiconductor layer, a first electrode connected to the first conductive type semiconductor layer and a second electrode connected to the second conductive type semiconductor layer;

connecting a first wire to each respective first electrode and connecting a second wire to each respective second electrode;

forming a first resin layer that covers each of the one or more light emitting elements such that an end portion of each first wire and an end portion of each second wire is exposed;

forming a first metal layer connected with each respective end portion of each first wire and forming a second metal layer connected with each respective end portion of each second wire;

forming a second resin on the first resin layer such that the first and second metal layers are embedded in the second resin; and cutting the second resin so as to form a second resin layer on the first resin layer, such that upper surfaces of the first and second metal layers are exposed from the second resin layer.

4. A method of manufacturing a plurality of light emitting devices, the method comprising:

providing a plurality of light emitting elements on a growth substrate, each light emitting element comprising a first conductive type semiconductor layer, a second conductive type semiconductor layer, a first electrode connected to the first conductive type semiconductor layer and a second electrode connected to the second conductive type semiconductor layer;

connecting a first wire to each respective first electrode and connecting a second wire to each respective second electrode;

forming a first resin layer that covers each of the light emitting elements such that an end portion of each first wire and an end portion of each second wire is exposed; and forming a first metal layer connected with each respective end portion of each first wire and forming a second metal layer connected with each respective end portion of each second wire;

forming a second resin layer on the first resin layer such that upper surfaces of the first and second metal layers are exposed from the second resin layer; and separating into individual light emitting devices each comprising at least one of the light emitting elements.

5. The method according to claim 2, wherein the second resin layer is formed such that the first and second metal layers are embedded in the second resin layer.

6. The method according to claim 4, wherein the second resin layer is formed such that the first and second metal layers are embedded in the second resin layer.

7. The method according to claim 2, wherein the step of forming the second resin layer comprises:

forming a second resin on the first resin layer such that the first and second metal layers are embedded in the second resin; and cutting the second resin so as to form the second resin layer on the first resin layer, such that upper surfaces of the first and second metal layers are exposed from the second resin layer.

8. The method according to claim 2, wherein:

the one or more light emitting elements comprises a plurality of light emitting elements, and the method further comprises separating into individual light emitting devices each comprising at least one of the light emitting elements.

9. The method according to claim 3, wherein:

the one or more light emitting elements comprises a plurality of light emitting elements, and the method further comprises separating into individual light emitting devices each comprising at least one of the light emitting elements.

10. The method according to claim 1, wherein the first and second wires comprise at least one material selected from the group consisting of Au, Cu, Al, Ag, and an alloy thereof.

11. The method according to claim 2, wherein the first and second wires comprise at least one material selected from the group consisting of Au, Cu, Al, Ag, and an alloy thereof.

12. The method according to claim 1, wherein a diameter of each of the first and second wires is 20 μm or greater and 3 mm or less.

13. The method according to claim 2, wherein a diameter of each of the first and second wires is 20 μm or greater and 3 mm or less.

14. The method according to claim 1, wherein a diameter of each of the first and second wires is 30 μm or greater and 3 mm or less.

15. The method according to claim 14, wherein the first and second wires comprise at least one material selected from the group consisting of Au, Cu, and an alloy thereof.

16. The method according to claim 2, wherein a diameter of each of the first and second wires is 30 μm or greater and 3 mm or less.

17. The method according to claim 16, wherein the first and second wires comprise at least one material selected from the group consisting of Au, Cu, and an alloy thereof.

18. The method according to claim 1, wherein the first and second metal layers comprise at least one material selected from the group consisting of Cu, Au, Ni, and Pd.

19. The method according to claim 3, wherein the first and second metal layers comprise at least one material selected from the group consisting of Cu, Au, Ni, and Pd.

20. The method according to claim 1, wherein a thickness of each of the first and second metal layers is in a range of 50 to 150 μm.

21. The method according to claim 3, wherein a thickness of each of the first and second metal layers is in a range of 50 to 150 μm.

22. The method according to claim 1, wherein the first and second resin layers contain a granular thermally conducting member.

23. The method according to claim 22, wherein the granular thermally conducting member comprises at least one material selected from the group consisting of carbon black and AlN.

* * * * *